US010305250B2

(12) United States Patent
Bhattacharya et al.

(10) Patent No.: US 10,305,250 B2
(45) Date of Patent: May 28, 2019

(54) III-NITRIDE NANOWIRE ARRAY MONOLITHIC PHOTONIC INTEGRATED CIRCUIT ON (001)SILICON OPERATING AT NEAR-INFRARED WAVELENGTHS

(71) Applicant: THE REGENTS OF THE UNIVERSITY OF MICHIGAN, Ann Arbor, MI (US)

(72) Inventors: Pallab Bhattacharya, Ann Arbor, MI (US); Arnab S. Hazari, Hillsboro, OR (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 15/809,598

(22) Filed: Nov. 10, 2017

(65) Prior Publication Data

US 2019/0067900 A1   Feb. 28, 2019

Related U.S. Application Data

(60) Provisional application No. 62/549,412, filed on Aug. 23, 2017.

(51) Int. Cl.
*H01S 5/02* (2006.01)
*H01S 5/026* (2006.01)
(Continued)

(52) U.S. Cl.
CPC ............ *H01S 5/0262* (2013.01); *G02B 6/132* (2013.01); *H01L 27/1443* (2013.01);
(Continued)

(58) Field of Classification Search
CPC ...... H01S 5/0262; H01S 5/021; H01S 5/0287; H01S 5/3407; H01S 5/3409; H01S 5/341;
(Continued)

(56) References Cited

U.S. PATENT DOCUMENTS 6,151,347 A   11/2000  Noel et al.
7,474,811 B1   1/2009  Quitoriano et al.
(Continued)

FOREIGN PATENT DOCUMENTS

WO   WO-2015/035518 A1   3/2015
WO   WO-2016/183678 A1   11/2016

OTHER PUBLICATIONS

Arafin et al., "Review of recent progress of III-nitride nanowire lasers," Nanophotonics 7(1):074599, 28 pages (2013).
(Continued)

*Primary Examiner* — Jerry M Blevins
(74) *Attorney, Agent, or Firm* — Marshall, Gerstein & Borun LLP

(57) ABSTRACT

Photonic devices such as semiconductor lasers and photodetectors of various operating wavelengths are grown monolithically on a Silicon substrate, and formed of nanowire structures with quantum structures as active regions. A reduction of strain during fabrication results from the use of these nanowire structures, thereby allowing devices to operate for extended periods of time at elevated temperatures. Monolithic photonic devices and monolithic photonic integrated circuits formed on Silicon substrates are thus provided.

22 Claims, 17 Drawing Sheets

(51) Int. Cl.

| | |
|---|---|
| H01S 5/34 | (2006.01) |
| H01S 5/343 | (2006.01) |
| G02B 6/132 | (2006.01) |
| H01L 31/0352 | (2006.01) |
| H01L 31/0304 | (2006.01) |
| H01L 31/173 | (2006.01) |
| H01L 31/18 | (2006.01) |
| H01L 31/109 | (2006.01) |
| H01S 5/028 | (2006.01) |
| H01S 5/42 | (2006.01) |
| H01S 5/40 | (2006.01) |
| H01L 27/144 | (2006.01) |
| H01S 5/042 | (2006.01) |
| H01S 5/183 | (2006.01) |
| G02B 6/12 | (2006.01) |
| H01L 31/0232 | (2014.01) |
| H01L 31/0224 | (2006.01) |

(52) U.S. Cl.
CPC .... *H01L 27/1446* (2013.01); *H01L 31/03044* (2013.01); *H01L 31/03048* (2013.01); *H01L 31/035218* (2013.01); *H01L 31/035227* (2013.01); *H01L 31/035236* (2013.01); *H01L 31/109* (2013.01); *H01L 31/173* (2013.01); *H01L 31/1848* (2013.01); *H01L 31/1852* (2013.01); *H01L 31/1856* (2013.01); *H01S 5/021* (2013.01); *H01S 5/0287* (2013.01); *H01S 5/341* (2013.01); *H01S 5/343* (2013.01); *H01S 5/3407* (2013.01); *H01S 5/3409* (2013.01); *H01S 5/34386* (2013.01); *H01S 5/405* (2013.01); *H01S 5/423* (2013.01); *G02B 2006/12121* (2013.01); *G02B 2006/12123* (2013.01); *H01L 31/02327* (2013.01); *H01L 31/022408* (2013.01); *H01S 5/0425* (2013.01); *H01S 5/183* (2013.01); *H01S 2304/02* (2013.01)

(58) Field of Classification Search
CPC ...... H01S 5/343; H01S 5/34386; H01S 5/405; H01S 5/423; G02B 6/132; H01L 27/1443; H01L 27/1446; H01L 31/03044; H01L 31/03048; H01L 31/035218; H01L 31/035227; H01L 31/035236; H01L 31/109; H01L 31/173; H01L 31/1848; H01L 31/1852; H01L 31/1856
USPC .......................................................... 385/14
See application file for complete search history.

(56) References Cited

U.S. PATENT DOCUMENTS

| | | | |
|---|---|---|---|
| 8,212,235 B2 | 7/2012 | Wang et al. | |
| 8,350,249 B1 | 1/2013 | Svensson | |
| 8,932,940 B2 | 1/2015 | Wang et al. | |
| 2006/0098705 A1* | 5/2006 | Wang | B82Y 10/00 372/50.124 |
| 2006/0205197 A1* | 9/2006 | Yi | H01L 21/0237 438/590 |
| 2006/0207647 A1* | 9/2006 | Tsakalakos | B82Y 20/00 136/256 |
| 2011/0127490 A1 | 6/2011 | Mi | |
| 2011/0133100 A1* | 6/2011 | Kambhampati | B82Y 20/00 250/459.1 |
| 2011/0163421 A1 | 7/2011 | Mi | |
| 2011/0249322 A1* | 10/2011 | Wang | B82Y 20/00 359/344 |
| 2012/0205613 A1 | 8/2012 | Mi et al. | |
| 2013/0026484 A1* | 1/2013 | Walukiewicz | H01L 29/778 257/76 |
| 2013/0240348 A1 | 9/2013 | Mi et al. | |
| 2014/0131730 A1* | 5/2014 | Keller | H01L 21/0254 257/76 |
| 2014/0219306 A1* | 8/2014 | Wright | H01S 5/18 372/45.012 |
| 2016/0027961 A1 | 1/2016 | Mi et al. | |
| 2016/0273115 A1 | 9/2016 | Mi et al. | |
| 2016/0365480 A1 | 12/2016 | Mi et al. | |
| 2017/0216810 A1 | 8/2017 | Mi et al. | |
| 2017/0323788 A1 | 11/2017 | Mi et al. | |

OTHER PUBLICATIONS

Bhattacharya et al., "III-Nitride Electrically Pumped Visible and Near-Infrared Nanowire Lasers on (0001) Silicon," Semiconductors and Semimetals, 96:385-409 (2017).
Bhattacharya et al., "InGaN/GaN Don-in Nanowire Monolithic LEDs and Lasers on (001) Silicon," Proc of SPIE vol. 10124, 8 pages (2017).
Bhattacharya et al., "III-Nitride Electrically Pumped Visible and Near-Infrared Nanowire Lasers on (001) Silicon," Semiconductors and Semimetals 96:385-409 (2016).
Bugallo et al., "Visible-blind photodetector based on p-i-n. junction GaN nanowire ensembles," Nanotechnology 21:315201, 5 pages (2010).
Chang et al., "Molecular beam epitaxial growth and characterization of non-tapered InN nanowires on Si(111)," Nanotechnology 20:345203 (2009).
Cheze et al., "Direct Comparison of Catalyst-Free and Catalyst-Induced GaN Nanowrites," Nano Res. 3:528-536 (2010).
Chimalgi et al., "Nonlinear Polarization and Efficiency Droop in Hexagonal InGaN/GaN Disk-in-Wire LEDs," Superlattices Microstruct. 84:91-98 (2015).
Deshpande et al., "Formation and Nature of InGaN Quantum Dots in GaN Naowires," Nano Lett. 15(3), 1647-1653 (2015).
Frost et al., "Monolithic Electrically Injected Nanowire Array Edge-Emitting Laser on (001) Silicon" Nano Lett. 2014 14(8) 4535-4541 (2014).
Grandjean et al., "Group-III nitride quantum heterostructures grown by molecular beam epitaxy," Phys. Condens. Matter 13(32):6945-6960 (2001).
Guo et al., "Catalyst-Free InGaN/GaN Nanowire Light Emitting Diodes Grown on (001) Silicon by Molecular Beam Epitaxy," Nano Lett. 10(9):3355-3359 (2010).
Han et al., "Photoconduction studies on GaN nanowrite transistors under UV and polarized UV illumination," Chem. Phys. Lett. 389:176-180 (2004).
Hazari et al., "III-nitride disk-in-nanowrie 1.2 µm monolithic diode laser on (001) silicon," Appl. Phys. Lett. 107:191107, 5 pages (2015).
Hazari et al., "1.3µm Optical Interconnect on Silicon: A Monolithic III-Nitride Nanowire Photonic Integrated Circuit," IEEE, 9 pages (2017).
Hazari et al., "An InN/InGaN/GaN nanowire array guided wave hotodiode on silicon," Applied Physics Letters 109:5 pages (2016).
Hazari et al., "III-Nitride Nanowire Array Edge-Emitting 1.3 µm Diode Laser on (0001) Silicon Substrate," IEEE 313-314 (2016).
Hazari et al., "Monolithic III-Nitride Nanowrie Detectors on Silicon," IEEE:232-233 (2016).
Hazari et al., "1.3µm Optical Interconnect on Silicon: A Monolithic III-Nitride Nanowire Photonic Integrated Circuit," IEEE Journal of Quantum Electronics (2017).
Hazari et al., "III-Nitride Nanowire Array Edge-Emitting 1.3 µm Diode Laser on (001) Silicon Substrate," IEEE Photonics Conference (IPC), pp. 313-314 (2016).
Hazari et al., "Monolithic III-Nitride Nanowire Detectors on Silicon," IEEE Photonics Conference (IPC), 232-233 (2016).
Hazari et al., "An InN/InGaN/GaN nanowire array guided wave photodiode on silicon," Appl. Phys. Left., 109:191102-1-191102-4 (2016).

(56) References Cited

OTHER PUBLICATIONS

Jahangir et al., "Molecular beam epitaxial growth and optical properties of red-emitting (λ=650 nm) InGaN/GaN disks-in-nanowires on silicon," Appl. Phys. Lett. 102:71101-1 to 71101-5 (2013).
Jeong et al., "UV-visible and infrared characterization of poly(p-xylylene) films for waveguide applications and OLED encapsulation," Synth. Met. 127(1):189-193 (2002).
Kim et al., "Monolithically Integrated InGaAs Nanowires on 3D Structured Silicon-on-Insulator as a New Platform for Full Optical Links," Nano Lett. 16(3);1833-1839 (2016).
King et al., "InN/GaN valence band offset High-resolution x-ray photoemission spectroscopy measurements," Phys. Rev. B 78(3):33308, 4 pages (2008).
Levy et al., "An 852x600 Pixel OLED-on-Silicon Color Microdisplay Using CMOS Subthreshold-Voltage-Scaling Current Drivers," IEEE J. Solid-State Circuits 37(12):1879-1889 (2002).
Liu et al., "Quantum dot lasers for silicon photonics," Photon. Res. 3(5), 9 pages (2015).
Mahan, "Phonon-Broadened Optical Spectra: Urbach's Rule," Phys. Rev. 145(2):602-608 (1966).
Merrill et al., "Giant growth-plane optical anisotropy in wurtzite InN/GaN disk-in-wire structures," Superlattices Microstruct. 52(5):949-961 (2012).
Mobarhan et al., "GaInAsP/InP 1.35 μm double heterostructure laser grown on silicon substrate by metalorganic chemical vapor deposition," J. Appl. Phys. 74(1):743-745 (1993).
Mubener et al., "Probing the Internal Electric Field in GaN/AlGaN Nanowire Heterostructures," Nano Lett. 14(9):5118-5122 (2014).
Ra et al., "Full-Color Single Nanowire Pixels for Projection Displays," Nano Letters 16:4608-4615 (2016).
Ra et al., "Scalable Nanowire Photonic Crystals: Molding the Light Emission of InGaN," Adv. Funct. Mater. 27:1702364 (2007).
Rigutti et al., "Ultravilet Photodetector Based on GaN/A1N Quantum Disks in a Single Nanowire," Nano Lett. 10(8):2939-2943 (2010).
Soref, "Silicon-based silicon-germanium-tin heterostructure photonics," Philos. Trans. R. Soc. London, Ser. A 372, 20130113 (2014).
Stark et al., "A monolithic electrically-injected nanowire array edge-emitting laser on (001) silicon," Proceedings vol. 9382, (2015).
Tasdemir et al., "Monolithic Fabrication of Silicon Nanowires Bridging Thick Silicon Structures," Digital Object Identifier 1:2-5 (2015).
Wang et al., "Conduction band offset at the InN/GaN heterojunction," Appl. Phys. Lett. 91:232117, 3 pages (2007).
Wu, "When group-III nitrides go infrared: New properties and perspectives," J. Appl. Phys. 106:11101, 29 pages (2009).
Wu et al., "Unusual properties of the fundamental band gap of InN," Appl. Phys. Lett. 80(21), 3967-3969 (2002).
Xu et al., "High speed, low noise ultraviolet photodetectors based on GaN p-i-n and AlGaN(p)-GaN(i)-GaN(n) structures," Appl. Phys. Lett. 71:2154-2156 (1997).
Zhao et al., "III-Nitride nanowire optoelectronics," Prog. Quantum Electron. 44:14-68 (2015).

\* cited by examiner

III-NITRIDE NANOWIRE ARRAY MONOLITHIC PHOTONIC INTEGRATED CIRCUIT ON (001)SILICON OPERATING AT NEAR-INFRARED WAVELENGTHS

CROSS-REFERENCE TO RELATED APPLICATION

This application claims priority to U.S. Provisional Application No. 62/549,412, entitled "III-Nitride Nanowire Array Monolithic Photonic Integrated Circuit On (001)Silicon Operating At Near-Infrared Wavelengths" and filed Aug. 23, 2017, which is incorporated herein by reference in its entirety.

STATEMENT OF GOVERNMENT SUPPORT

This invention was made with government support under grants ECCS-1648870 and DMR-1120923 awarded by the National Science Foundation. The government has certain rights in the invention.

FIELD OF THE DISCLOSURE

The present disclosure relates to solid-state semiconductor devices and, more specifically, to the monolithic growth of nanowire array quantum structures on Silicon (Si) substrate and photonic devices formed thereof.

BACKGROUND

Every year electronic devices become faster. This happens because of Moore's law which states that transistors, which are the major element of all electronic circuits, become smaller every year. This trend results in a higher density of the number of transistors that can be fabricated on a microchip. One of the biggest technological concerns of the $21^{st}$ century is the possible saturation of Moore's law and as a consequence the improvement of device speed with time may come to an end.

Many techniques have been suggested to keep Moore's law relevant. One of them is the incorporation of photonic devices on Silicon (Si) microchips, which would further improve the speed of the next generation devices such as microchips and integrated circuits, with light being much faster than electricity.

Currently, the main high-volume industrial manufacturing technology that is used to produce integrated circuits, such as electronic microchips and computer microprocessors, is Complementary Metal-Oxide-Semiconductor (CMOS) technology. Current CMOS microchips in the microelectronics industry are based on (001) Silicon (Si) substrates. Hence initial photonic devices also have to be compatible with (001) Silicon. Unfortunately, Si itself cannot emit light. To circumnavigate this problem, in conventional systems, lasers made of other materials have been fabricated separately and then placed on the Si substrate.

SUMMARY OF THE INVENTION

The present techniques include methods of fabricating photonic devices, such as semiconductor diode lasers, formed of nanowire structures grown monolithically on a Silicon substrate, and in particular on a (001) Silicon substrate. The photonic devices may be monolithically grown by growing an array of III-V nanowires directly from the (001) Silicon substrate in a single epitaxial growth process. The result is a monolithic structure in which a nanowire array of one type of semiconductor material is grown extending from a substrate of another semiconductor material, in particular Silicon.

In some examples, monolithically grown nanowires are grown as an array of nanowires, where the array may be formed into different photonic devices. In some examples, the photonic devices are edge emitting lasers formed from nanowires monolithically grown in the Silicon substrate. In some examples, the photonic devices are vertical cavity surface emitting lasers formed from nanowires monolithically grown in the Silicon substrate. The lasers may operate for extended periods of time under continuous wave or pulsed operation at elevated temperatures. Other photonic devices formed of these monolithically grown nanowire arrays include photodetectors.

Instead of traditional planar epitaxial layers, in some examples, the present techniques are able to form by monolithically grown nanowires having quantum structures that form the active gain region of a laser or form the absorption region in a photodetector. In these examples, monolithic growth may be achieved through the growth of nanowires, from which monolithic photonic devices are thereby formed from these nanowires. A reduction of strain results from using nanowire structures and that has made it possible for these devices to be formed monolithically on Silicon substrate and for these devices to operate under continuous wave or pulsed mode of operation for extended periods of time at elevated temperatures. In other words, in various examples, photonic devices are thermally stable and their performance does not degrade significantly with increasing temperatures.

In some examples, the present techniques provide a complete monolithic photonic integrated circuit directly grown on (001) silicon. In some examples, the circuit includes a diode laser, dielectric waveguide, and photodetector. The diode laser may be an edge-emitting laser and the photodetector a guided-wave photodiode, where both are fabricated of the same III-nitride nanowire arrays, providing more flexibility to these devices.

The present techniques also include the fabrication of a nitride-based nanowire array photodiode on silicon. For example, in some implementations, a nanowire array photodiode may be formed exhibiting a large responsivity at 1.3 μm, making the photodiodes ideal for silicon photonics and on-chip communication, as described. The photodiodes may be realized with the same monolithic nanowire array as used to form a monolithic semiconductor laser, but the photodiode may be operated under reverse bias, in contrast the semiconductor laser which is operated under forward bias.

The present techniques further provide the fabrication of a monolithic laser, which can be used for coherent light optical communication, inter-chip or intra-chip. The present techniques provide for lasers with emission wavelength of 1.3 μm, which is a desirable wavelength, as this particular wavelength produces low light dispersion in $SiO_2$ and is transparent to silicon. This wavelength also allows eye-safe operation.

The present techniques further provide the first monolithic photonic integrated circuit directly grown on (001) silicon substrate. In some examples, a photonic integrated circuit may be formed of a monolithic semiconductor laser having emission wavelength at or around 1.3 μm and a detector having 0.1 A/W responsivity at 1.3 μm, each grown on a (001) silicon subsrate. In some examples, the active material of the laser and detector is an array of InN/InGaN/GaN heterostructure nanowires. In some examples, InN disks have been inserted in GaN nanowires and this enables laser emission and detector absorption at 1.3 μm in the photonic integrated circuit.

The photonic integrated circuit is useful in silicon photonics based applications, i.e., on-chip communication etc. The laser output power, detector responsivity, and overall response of the photonic integrated circuit is sufficiently large for such applications. The lasers show high temperature stability, and good differential gain. The detector photocurrent response follows the laser injection current well, demonstrating a successful photonic integrated circuit on (001) Si. These characteristics can be exploited in a variety of applications where the environment can be challenging, e.g., smart car engine systems.

In some examples, the present techniques provide particular advantages over conventional systems. Graded layer regions have been grown in III-Nitride nanowire laser structures. The growth of InN disks as the active region has been achieved, thus providing for emissions in the near infrared, e.g., at 1.3 μm. A III-nitride nanowire photodiode operating at near-infrared using InN disks has been demonstrated. The external deposition of a dielectric to form a waveguide in between a monolithically grown nanowire laser and a monolithically grown nanowire photodetector to fabricate a complete photonic integrated circuit has been shown.

In accordance with an example, a semiconductor device comprises: a Silicon (Si) substrate; and a III-Nitride nanowire structure having (i) a quantum region formed of one or more layers of InN quantum disks, (ii) a first graded layer region, and (iii) a second graded layer region, wherein the quantum region is located between the first graded layer region and the second graded layer region, and wherein the III-Nitride nanowire structure is monolithically grown from the Si substrate, and wherein the III-Nitride nanowire structure is responsive at or about 1.3 μm.

In accordance with another example, a nanowire array structure comprises: a Silicon (Si) substrate; and a plurality of III-Nitride nanowire structures each having (i) a quantum region formed of one or more layers of InN quantum disks, (ii) a first graded layer region, and (iii) a second graded layer region, wherein the quantum region is located between the first graded layer region and the second graded layer region, wherein the plurality of III-Nitride nanowire structures are monolithically grown from the Si substrate, and wherein the plurality of III-Nitride nanowire structures are responsive at or about 1.3 μm.

In accordance with another example, a photonic integrated circuit comprises: a Silicon (Si) substrate; a first plurality of III-Nitride nanowire structures each having (i) a quantum region formed of one or more layers of InN quantum disks, (ii) a first graded layer region, and (iii) a second graded layer region, wherein the quantum region is located between the first graded layer region and the second graded layer region, wherein the first plurality of III-Nitride nanowire structures are monolithically grown from the Si substrate, and wherein the first plurality of III-Nitride nanowire structures form a nanowire semiconductor laser capable of emitting a photonic output at or about 1.3 μm; and a second plurality of III-Nitride nanowire structures each having (i) a quantum region formed of one or more layers of InN quantum disks, (ii) a first graded layer region, and (iii) a second graded layer region, wherein the quantum region is located between the first graded layer region and the second graded layer region, wherein the second plurality of III-Nitride nanowire structures are monolithically grown from the Si substrate, and wherein the second plurality of III-Nitride nanowire structures form a nanowire semiconductor photodetector capable of absorbing a photon input at or about 1.3 μm.

BRIEF DESCRIPTION OF THE DRAWINGS

FIG. 12A illustrates the formation of epitaxial crystal growth layers in the nanowire array using a plasma assisted molecular beam epitaxy (PA-MBE) technique; and FIG. 12B illustrates a Parylene planarization process from FIG. 11, in accordance with an example.

FIG. 13A illustrates fabrication after a p-metal deposition over a selected array of the nanowire array has occurred. FIG. 13B illustrates fabrication after an etching of the nanowire array has been performed to form a channel resulting in two spaced apart nanowire arrays, in accordance with an example.

FIG. 14A illustrates fabrication after an n-metal deposition has been performed over selected areas of the exposes n-Silicon substrate. FIG. 14B illustrates fabrication after waveguide layers have been deposition is a channel between nanowire arrays, e.g., between a nanowire array forming a semiconductor laser and a nanowire array forming a photodetector.

DETAILED DESCRIPTION

The present techniques include methods of fabricating photonic devices, such as semiconductor lasers and photodiodes, formed of nanowire structures grown monolithically on a Silicon substrate, and in particular on a (001) Silicon substrate. The devices are monolithically grown by growing an array of III-V nanowires directly from the (001) Silicon substrate in a single epitaxial growth process. The result a monolithic structure in which a nanowire array of one type of semiconductor material is grown extending from a substrate of another semiconductor material, in particular Silicon.

In some examples, these monolithically grown nanowires are grown as an array of nanowires, where the array may be formed into different photonic devices. In some examples, the photonic devices are edge emitting lasers formed from nanowires monolithically grown in the Silicon substrate. In some examples, the photonic devices are vertical cavity surface emitting lasers formed from nanowires monolithically grown in the Silicon substrate. The lasers may operate for extended periods of time under continuous wave or pulsed operation at elevated temperatures. Other photonic devices formed of these monolithically grown nanowire arrays include photodetectors.

In various examples, as described, III-nitride nanowire lasers and photodiodes are monolithically grown, having identical heterostructures and constituent material sections. In this way, these structures are able to form a monolithically grown photonic integrated circuit that can be realized by one-step epitaxy on (001) silicon substrates, adding significant flexibility to device and circuit fabrication. While nanowire arrays have been incorporated in the design of lasers emitting in the visible range, the nanowire heterostructure described in various examples herein are different in fundamental ways. Nanowire heterostructures in some examples herein are formed of: (i) InN disks inserted to form the light emission/absorption region of the respective devices; and (ii) graded InGaN regions incorporated for strain balancing in the heterostructure, reduction of defect density and optimal guiding of light in the lasers and detectors.

Further still in various examples herein, the present techniques include the fabrication of a nitride-based nanowire array lasers and photodiodes monolithically grown on silicon. In particular, nanowire array lasers and photodiodes exhibiting large responsivity at 1.3 µm are shown.

Figure 1:
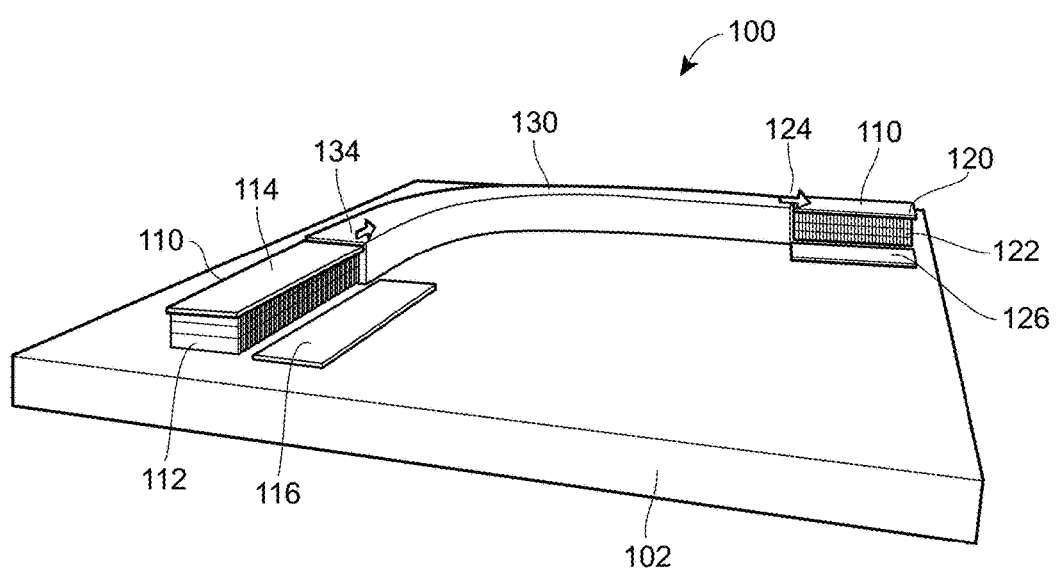
FIG. 1 depicts a nanowire quantum semiconductor laser and a nanowire quantum semiconductor detector both monolithically grown on a Silicon substrate forming a monolithically fabricated photonic integrated circuit, in accordance with an example.
Figure 2:
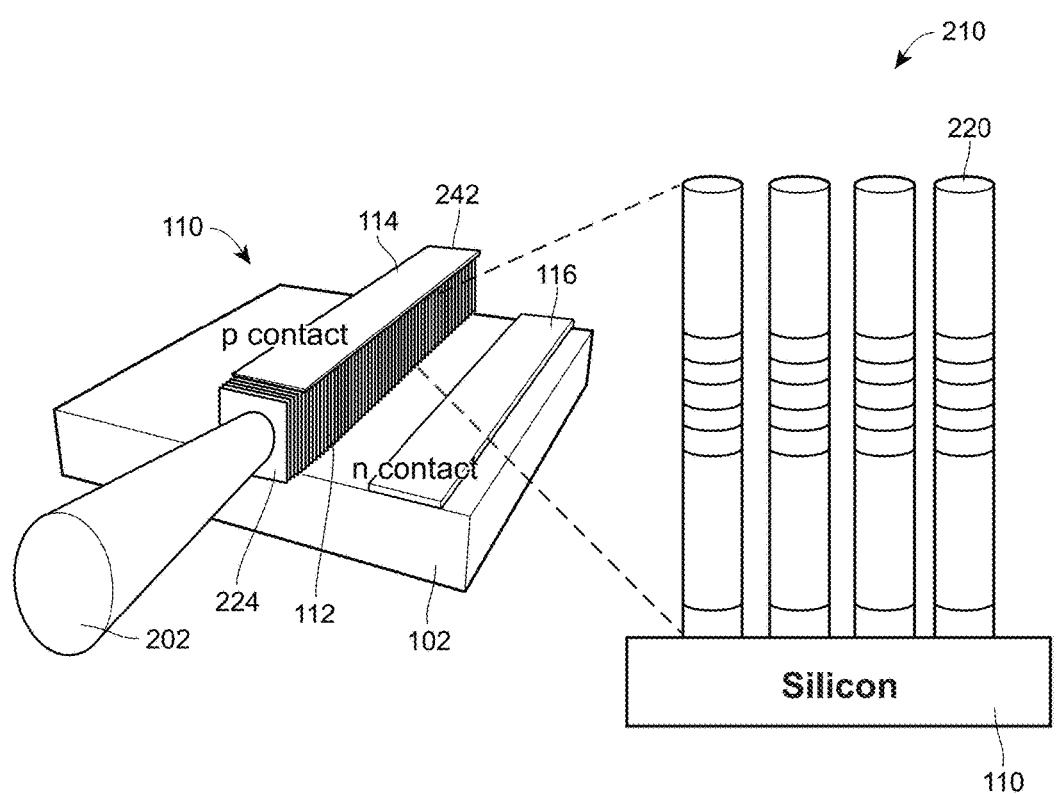
FIG. 2 depicts an example of the nanowire quantum semiconductor laser of FIG. 1 and, in particular, showing a nanowire array structure within the laser, in accordance with an example.

From the formation of such elements, the present techniques further provide the monolithic photonic integrated circuit directly grown on (001) silicon substrate. Many applications can use near-infrared (NIR) lasers and photodiodes operating at wavelengths of ~1.3 µm. These include such electronic applications as on-chip and off-chip communication to design faster processors and computers. Together with a waveguide and detector these lasers can serve as a complete on-chip monolithic photonic link or optical interconnect. FIGS. 1 and 2 illustrate an example photonic integrated circuit (PIC) formed monolithically on a Silicon substrate.

FIG. 1 depicts a monolithically grown nanowire quantum semiconductor laser and a monolithically grown nanowire quantum semiconductor detector both grown on a Silicon substrate and both combing to form a monolithically fabricated photonic integrated circuit 100. In the illustrated example, the integrated circuit 100 is formed of a curved waveguide in addition to a laser and a detector.

More specifically, in the illustrate example, photonic integrated circuit 100 includes a semiconductor laser 110 formed of a nanowire array structure 112 at its core, wherein the laser 110 is monolithically grown on a (001) Silicon substrate 102. In operation, with an electric voltage applied to the laser 110, an electric current is injected into the laser 110 through a p-contact metal electrode 114 and a n-contact metal electrode 116. In the illustrated example, the laser 110 is configured as an edge-emitting laser, such that light 134 that is emitted from the laser 110 and travels along a waveguide 130 (also part of the circuit 100) from which the light exists (as light 136) and is absorbed by a photodetector 120 (also part of the circuit 100). The light 136 absorbed by the detector 120 may be the same light 134 emitted by the laser 110. Note that throughout this disclosure the terms detector, photodetector, and photodiode are used interchangeably.

The photodetector 120 is formed of a nanowire array structure 122. In the illustrated example, the nanowire array structure 112 of the laser 110 and the nanowire array structure 122 of the photodetector 120 are identical. However, in other implementations, the nanowire array structure 122 may be a different structure with different compositions and different design than the nanowire array structure 112. Depicted are also a p-type metal electrode 124 and an n-type metal electrode 126 of the photodetector 120.

The photonic integrated circuit 100 is a monolithically grown circuit, where the semiconductor laser 110 and the semiconductor photodetector 120 have been monolithically grown on (001) Si substrate. As described further, the semiconductor laser 110 may operate under a continuous wave (CW) mode of operation for extended periods of time (~1000 hours or more). Both the laser 110 and the photodetector 120 are thermally stable and their functionality and performance are stable with increasing temperatures. The semiconductor laser 100 may be monolithically grown having different epitaxial crystal layers forming the heterostructure, which depending on their composition and structure will emit (absorb) at different wavelengths, including the desirable wavelength of ~1.3 μm. In this way, the present techniques provide a first of its kind and tunable design photonic devices and photonic integrated circuit grown monolithically from a Silicon substrate.

FIG. 2 depicts a more detailed illustration of the monolithic nanowire array quantum semiconductor laser 110 monolithically grown on a (001) Silicon substrate. An array 210 (also termed herein a cluster) of four individual nanowire structures 220 that are part of the densely packed nanowire array structure 112, where these nanowire structures are grown monolithically on the Si substrate 102, e.g., using a single step epitaxial growth process or in some examples using a multiple step epitaxial growth process.

In the illustrated example, the semiconductor laser 110 is an edge-emitting type of laser device. This type of edge-emitting semiconductor laser 110 typically has two mirror facets. In FIG. 2, according to one possible example, a mirror facet 242 (not visible in the drawing) of the laser device 110 points in the direction of the waveguide structure 130 and another mirror facet 244 of the laser device 110 points in the opposite direction which could be pointing into another waveguide structure or, as depicted in this particular embodiment, emit light into the air in the form of a beam of light 202. The nanowire array structure 112 emitting in the NIR, e.g., at or around 1.3 μm, may have unique nanowire heterostructures that include (i) InN disks forming the quantum active region and (ii) graded InGaN regions for strain balancing in the heterostructure, reduction of defect density and optimal guiding of light in the lasers and detectors.

In telecommunication applications a semiconductor laser with an emission wavelength at or around 1.3 μm can be used in single-mode or multi-mode communication. The laser devices which are described in this disclosure demonstrate a wavelength of emission at or around this important 1.3 μm wavelength. However, this same technology that is described in this disclosure can be used to fabricate semiconductor lasers, grown monolithically on Si substrate, that have a wavelength of emission at or around other wavelengths including 1.55 μm. Such devices operating at the wavelength of ~1.55 μm, and grown monolithically on Silicon substrate, may be useful in long-haul fiber-optic links within the data communication and telecommunication industries.

More broadly, the techniques described herein may be used for any type of photonic integrated circuit. Silicon Complementary Metal-Oxide-Semiconductor (CMOS) microchip applications can now be achieved using epitaxial growth and monolithic growth and integration of semiconductor lasers and optical detectors with guided wave components on a (001) Si wafer, with components preferably operating in the wavelength range of 1.3 μm to 1.55 μm at room temperature. Techniques demonstrated in the past for having optically pumped or electrically pumped GaAs and InP based semiconductor lasers on Silicon included wafer bonding, selective area epitaxy, epitaxy on tilted substrates, and use of quantum dot or planar buffer layers. The present techniques, however, provide a monolithic optical interconnect on a (001) Si substrate comprising of a nanowire array edge emitting electrically pumped semiconductor laser and guided wave photodetector, with a planar dielectric waveguide in between the laser and the photodetector. The laser and the photodiode devices are realized with the same nanowire heterostructure by one-step epitaxial crystal growth process, as further described below. An example structure is a III-Nitride dot-in-nanowire array edge emitting semiconductor laser and guided wave photodetector, with a planar $SiO_2/Si_3N_4$ dielectric waveguide in between the laser and the photodetector.

Further still, the present techniques may be used to form lasers in inter-chip or intra-chip communication applications, such as those related to optical communication applications. Semiconductor lasers with emission wavelength at 1.3 μm are desirable as this particular wavelength produces least dispersion in $SiO_2$ and is transparent to Silicon. This wavelength also allows eye-safe operation. Hence the emitted light has negligible attenuation in Si-based devices and more signals (or channels) can be accompanied if the light is guided using $SiO_2$ based waveguides. Making such an electrically pumped semiconductor laser directly and monolithically on Silicon has proven to be a great challenge to the photonic industry.

While the primary examples described are that of NIR emissions and photodetection, the techniques may be used to form monolithically grown nanowire semiconductor lasers emitting over a range of frequencies, including in a green region of the spectrum, a red region of the spectrum, and infra-red region of the spectrum. Particular examples include emissions at or about 1.3 μm, at or about 560 nm, at or about 610 nm, at or about 630 nm.

We now turn to describing monolithic growth techniques and further example photonic devices that can be formed of nanowire structures grown in accordance with the techniques herein.

Since Silicon (Si) with an indirect bandgap is an inefficient light-emitting semiconductor. The common technique of incorporating an electrically-pumped laser on a Silicon platform has been the integration of III-V based devices on it, either by direct epitaxy or by wafer bonding techniques. Direct epitaxial growth of III-V materials and heterostructures on Silicon presents three challenges. A usually large lattice mismatch leads to a high density of threading dislocations. There is also a thermal mismatch due to unequal thermal expansion coefficients. Finally, the epitaxy of polar III-V materials such as GaAs on non-polar Si leads to the formation of antiphase domains (APDs). This is usually alleviated by growing the III-V heterostructure on a (001) Si substrate offcut by 4° toward the [011] plane. It is unlikely that CMOS and related Si-based technologies will be developed on such tilted platforms. Selective area epitaxy and growth on special buffer layers have led to some success.

A different approach to solving the Si and III-V mismatch problem is to use entirely different semiconductors, the III-nitride compounds, but not in their usual planar form.

(Al, Ga, In)N nanowires and nanowire heterostructures grown catalyst-free on (001) Si substrates have shown extraordinary promise as crystalline (wurtzite) nanostructures for the realization of visible light-emitting diodes (LEDs) and diode lasers. We demonstrate the application of such nanowires, grown on silicon, to near-infrared (1.3 μm) lasers and photodetectors. Without any patterning on the substrates the nanowires grow as a random array along the c-axis and are relatively free of extended defects due to the large surface-to-volume ratio and the formation of a thin $SiN_x$ layer at the nanowire-Silicon interface.

The $SiN_x$ layer reduces the ~13.5% stress and reduces the defect density at the interface. Compared to planar heterostructures, the nanowires have reduced polarization field due to radial relaxation of strain during epitaxy. Consequently, the radiative recombination times are smaller than in quantum wells. Thin (2 nm to 3 nm thick) single or multiple InGaN disks can be incorporated along the length of the nanowires and the alloy composition in the disk region can be varied to yield optical emission ranging from the ultraviolet (UV) to near-infrared (near-IR). It has been established that a quantum dot is formed in the disk region, possibly due to strain relaxation along the surface of the nanowire during epitaxy. It has also been reported that the surface recombination velocity of GaN nanowires is small and about ~$10^3$ cm/s. In contrast to conventional techniques, the self-organized random array of nanowires can be grown on any size of Si substrate, depending on the growth facility, and the process is therefore scalable. The nanowire area density can be varied in the range of $10^7$ cm$^{-2}$ to $10^{11}$ cm$^{-2}$ by tuning the growth parameters. Sections of the nanowires can be doped n-type and p-type and thereby diodes can be realized.

Figure 3A:
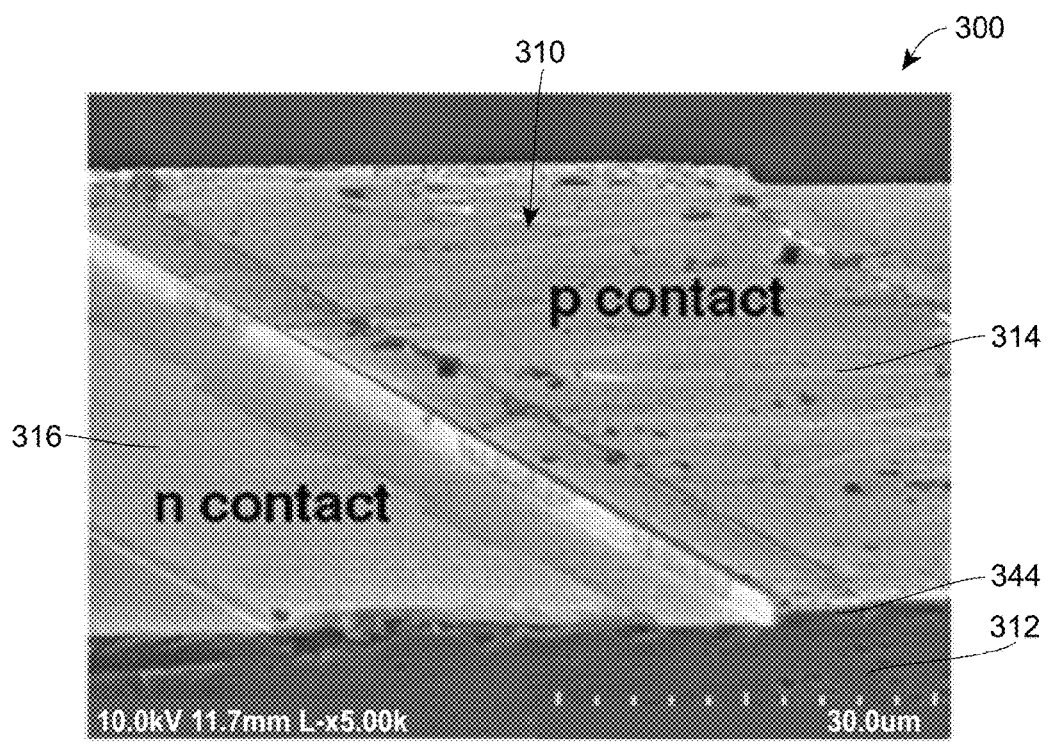
FIG. 3A depicts a Scanning Electron Microscope (SEM) image of a monolithically grown semiconductor laser device, in accordance with the example of FIG. 2.
Figure 3B:
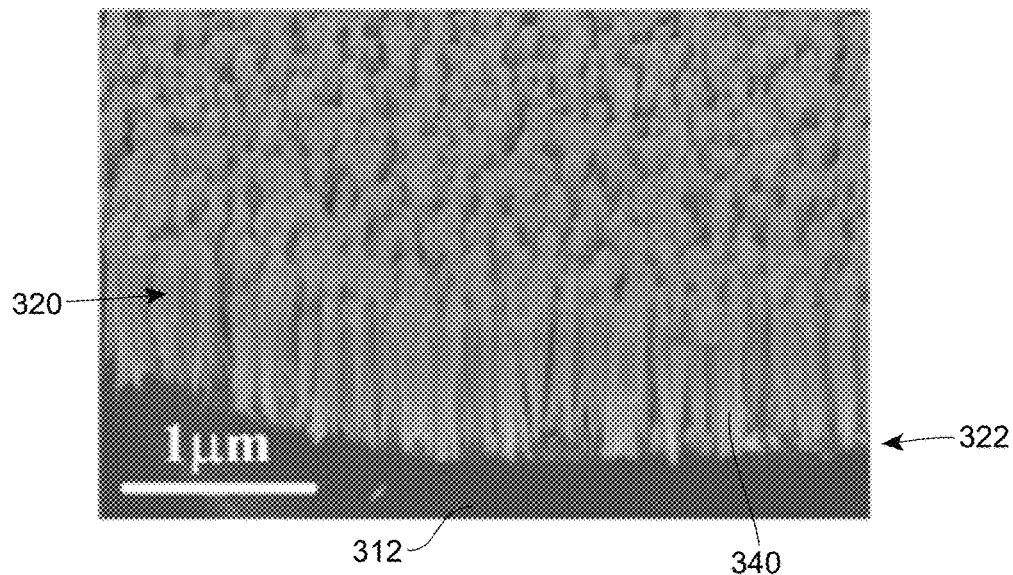
FIG. 3B depicts a SEM image of an InGaN/GaN disk-in-nanowire array formed of multiple nanowires structures clustered together, in accordance with an example.

The unique properties of structures such as III-Nitride nanowire and their heterostructures make possible the realization of nanowire-based photonic integrated circuits with active devices on a (001) Si substrate platform. Of particular interest is a monolithic optical interconnect consisting of a diode laser, a passive waveguide or other guided-wave elements, and a photodiode. As used herein, the terms "diode laser", "laser", "laser diode", and "semiconductor laser" are used interchangeably. With modulation of the semiconductor laser, this example photonic integrated circuit would constitute an optical communication system FIG. 3A depicts a SEM image of a ridge waveguide semiconductor laser 310 that is grown monolithically on a Si substrate 312. FIG. 3B depicts a SEM image of GaN nanowire array structure depicting multiple nanowire structures clustered together to form a densely packed nanowire array structure. The laser 310 in this example is approximately about 50 μm wide. A p-type metallic contact 314 and an n-side metallic contact 316, similar to that of FIG. 1, are also shown in addition to a portion of a front mirror facet 344.

The laser 310 is formed for a nanowire array structure 320 includes densely packaged array of individual nanowires 340 monolithically grown on the Si substrate 312. An interface region 322 is shown between the nanowire array 320 and the Si substrate 312.

Figure 4:
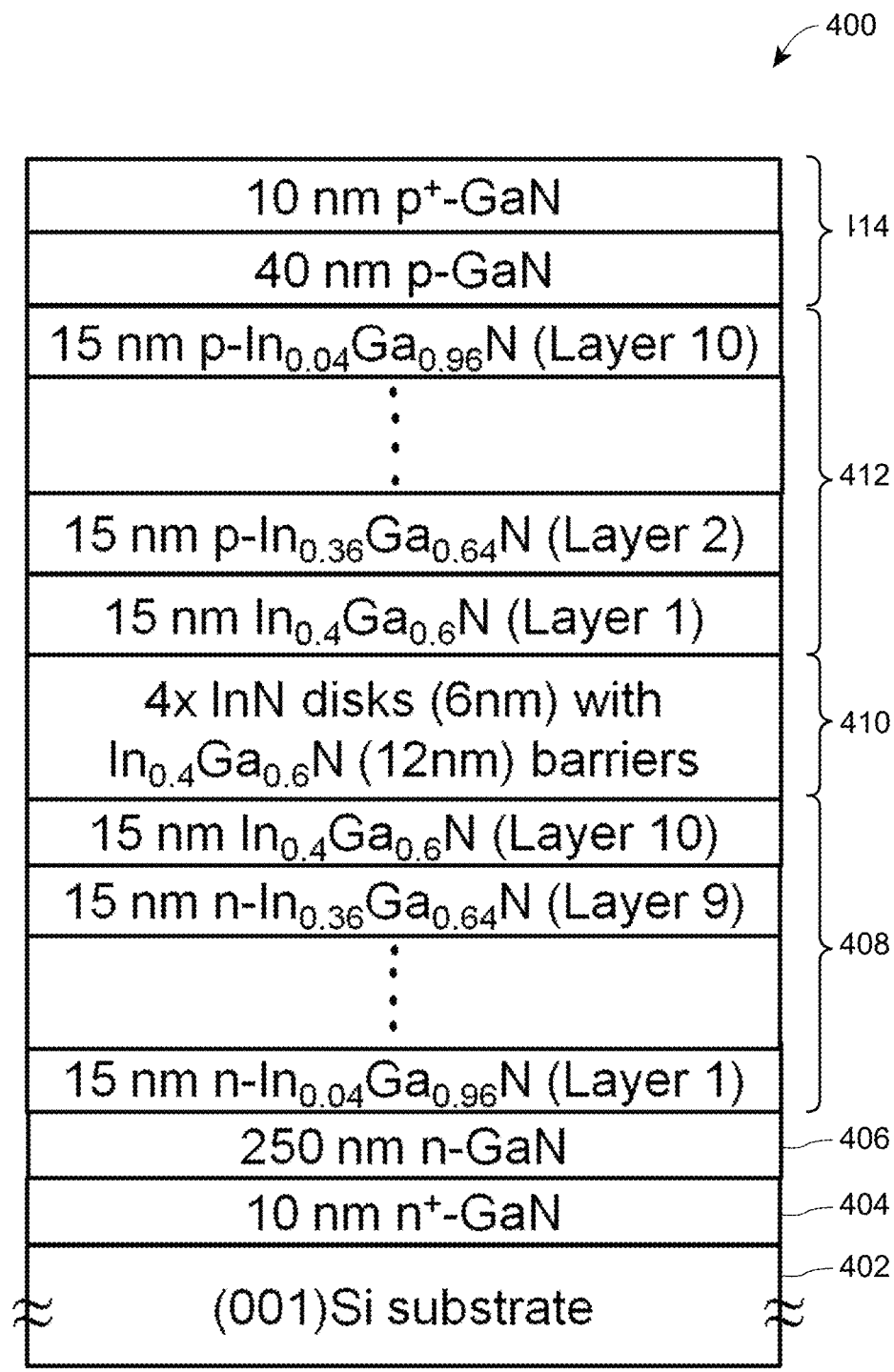
FIG. 4 illustrates the epitaxial crystal structure of a monolithically grown nanowire array semiconductor laser, in accordance with an example. Depicted in the diagram are various crystal layers within a nanowire structure, in particular, an example epitaxial crystal structure of an individual InN/In$_{0.4}$Ga$_{0.6}$N/GaN heterostructure nanowire, capable of emitting in the visible (530 nm) and included within an array of densely packed nanowire structures monolithically grown on (001) Si substrate, in accordance with an example.

FIG. 4 illustrates the epitaxial crystal structure 400 of a nanowire semiconductor laser designed for emission at a wavelength at or about 1.3 μm. As used herein, references to emissions (or absorptions) "at or about" or "approximately" or "~" 1.3 μm refers to emissions (or absorptions) at 1.3 μm±0.05 μm. Emissions (absorptions) at 1.3 μm are preferred for telecommunication applications and Si CMOS fabrication. The various crystal layers within the nanowire structure are depicted, showing the different layer compositions. What is depicted in the diagram is the epitaxial crystal structure of an individual InN/In$_{0.4}$Ga$_{0.6}$N/GaN nanowire structure, which may be included within an array of densely packed nanowire structures monolithically grown on (001) Si substrate, such as substrate 402. The first epitaxial crystal layer that is grown directly on top of the (001) Si substrate 402 is a 10 nm thick n$^+$-GaN layer 404. This is followed by a 250 nm thick n-GaN layer 406. Ten (10) semiconductor crystal layers 408, in this example comprising of In$_x$Ga$_{1-x}$N material of various compositions in which the Indium (In) content portion, are grown. As indicated, for the In$_x$Ga$_{1-x}$N layers x varies from about 0.04 to 0.4. The layers of 408 form a graded layer region of the heterostructure, where each of the 10 layers shown has different In and Ga concentrations, where in the illustrated example those concentrations increase/decrease with each successive layer. The thickness of each of these ten layers of In$_x$Ga$_{1-x}$N is about 15 nm.

An InN/InGaN active region 410 is then formed. In the illustrated example, the active region 410 includes 4 layers of InN each about 6 nm thick. These InN layers are surrounded by In$_{0.4}$Ga$_{0.6}$N barrier layers of about 12 nm thickness. The InN layers comprise the quantum structures which in this embodiment, and according to example, are quantum disk. Grown on top of the active region 410 are ten semiconductor crystal layers 412, which form a graded layer region. In the illustrated layers 412 are formed of In$_x$Ga$_{1-x}$N material of various compositions in which the Indium (In) content portion, as indicated, x, in In$_x$Ga$_{1-x}$N, varies from about 0.04 to 0.4. The thickness of each of these ten layers of In$_x$Ga$_{1-x}$N material is about 15 nm. At the top of the nanowire structure are grown the p-type GaN layers 414 which, in this embodiment and according to an example, comprise of a 40 nm thick p-GaN layer followed, at the top of the nanowire structure, by a 10 nm thick p$^+$-GaN layer.

An example fabrication of a graded refractive index separate confinement heterostructure (GRIN-SCH) nanowire structure 400 is as follows. The nanowire structure 400 was monolithically grown by plasma-assisted molecular beam epitaxy (PAMBE) on (001) Si substrates in a Veeco GEN II system. In this fabrication example, the entire nanowire structure 400 was grown with a nitrogen plasma flow rate of 1 sccm. GaN sections 404, 406, and 414 were grown at a substrate temperature of 820° C., except the top p$^+$-GaN region of 414, which was grown at 800° C. The graded In$_x$Ga$_{1-x}$N regions (0≤x≤0.4) 408, 410, and 412 forming the surrounding graded layers and active region were grown in 10 equal steps of 15 nm on both sides of the gain region consisting of 4 InN disks of thickness 6 nm surrounded by 12 nm In$_{0.4}$Ga$_{0.6}$N barriers 410. The graded regions were grown at substrate temperatures varying from 631° C. (In$_{0.4}$Ga$_{0.6}$N) to 819° C. (GaN) and the entire InN-disk and In$_{0.4}$Ga$_{0.6}$N-barrier region was grown at 489° C. The Gallium (Ga) and Indium (In) fluxes were in the range of 1.1×10$^{-8}$ to 1.2×10$^{-7}$ Torr and 2×10$^{-8}$ to 1×10$^{-7}$ Torr, respectively, depending on the composition of the material being grown. The height, diameter and density of the nanowires are estimated to be ~400 nm, ~60 nm, and ~3.2×10$^{10}$ cm$^{-2}$ respectively, and the fill factor is estimated to be 0.91.

In examples herein, the 1.3 μm semiconductor laser may have an active area (laser gain region) that includes a particular type of quantum structure referred to as quantum dot structure. The particular type of quantum dot structure may be a quantum disk structure, which is one variety of quantum dot structure. These quantum disks, in some implementations, are comprised of InN material surrounded by InGaN barriers. Such active InN quantum disks have been incorporated in nanowire structures for the first time, as a result of the present techniques.

Instead of traditional planar epitaxial layers, nanowire structures with quantum disks were used for the laser gain material. Use of nanowire structures reduces strain in the heterostructure layers of the laser, which has enabled the inventors to incorporate Indium Nitride (InN) quantum disks that can emit light at near-infrared wavelengths including at the wavelength of, at or around, 1.3 µm. The reduction of strain, through the use of the nanowire structures, also has made it possible for these devices to operate under CW mode of operation for extended periods of time (e.g. ~1000 hours or more). At the same time these lasers can operate at elevated temperatures. Indicative of this is the relatively high characteristic temperature, also referred to as the T-zero ($T_0$) parameter, of these lasers. A high $T_0$ value indicates that the performance of the laser decreases less rapidly with increasing temperatures. These nanowire structure laser devices are thermally stable devices and their performance does not degrade significantly with increasing temperatures, another feature heretofore unattainable with conventional techniques.

Example quantum structures that may be used to form the laser gain regions include quantum disks, as well as other quantum dot structures, including quantum spheres, quantum disks, core-shell quantum structures, or other similar forms of quantum elements and/or quantum structures. The term quantum dot is herein used to refer to all these various possible shapes of quantum structure within the nanowire structure, one particular type of which, according to an example, is the quantum disk. As such, any of the techniques and devices herein may be implemented using any of a variety of quantum structures, and are not limited only to quantum disks.

The quantum structures herein may be disk-in-nanowire (DINW) structures grown using state-of-the-art plasma assisted molecular beam epitaxy (MBE). The term DINW refers to nanowire structures which have quantum disks embedded within them. From transmission electron microscopy (TEM) images it has been demonstrated that these quantum disks form quantum dot type of structures, which further improve the device characteristics. The nanowire structures were grown in a nitrogen plasma rich environment on a (001) Silicon substrate. Typical nanowire heterostructures consist of a graded cladding layer that reduces the strain and improves the light confinement. As stated before, to achieve near-infrared emission while keeping the advantages of quantum confinement, InN disks were grown between $In_{0.4}Ga_{0.6}N$ barriers. Such demonstration of InN disk-in-nanowires is the first and only one of its kind. The InN/InGaN quantum disks have excellent optical properties, which are exploited in the lasers.

Once the material is grown and characterized, lasers were fabricated using a series of steps including Parylene planarization, photolithography, plasma etch, and metallization. These ridge waveguide lasers have 5 µm wide to 50 µm wide laser ridge widths and variable lengths. The laser facets were formed by focused ion beam (FIB) etching technique and subsequent deposition of $ZnSe/MgF_2$ distributed Bragg reflector (DBR) mirrors.

The lasers were characterized in a state-of-the-art optoelectronics laboratory. Maximum output power was found to be 7 mW. Characteristic temperature of these laser devices was found to be 220 K. The differential gain parameter was found to be $3\times10^{-16}$ $cm^2$. The differential gain was measured using high speed measurement techniques from which the bandwidth of these lasers were also found to be ~3 GHz. Such characteristic properties of these lasers make them an ideal candidate for silicon photonics based applications. A liquid nitrogen cooled Ge detector was used to measure the electroluminescence properties of the lasers and the peak emission wavelength at stimulated emission was found to be ~1.3 µm which is again ideal for on-chip photonic applications. The novel active (gain) material, straight forward fabrication process and favorable characteristics can make these nanowire structure lasers that are grown monolithically on Silicon substrate one of the most important elements in silicon photonics.

The technology, the devices, and the methods that are described herein in this disclosure have several advantages that are apparent. For example, as the lasers are grown on (001) Silicon, they are CMOS-technology compatible. Hence the technology can be transferred to the microelectronics industry. In addition, the III-nitride based lasers demonstrate high characteristic temperature making them suitable for challenging environments (e.g. computer servers, automobiles, etc.). Also, the 1.3 µm emission wavelength is ideal for multi-mode communication applications with the data communication and telecommunication industries.

In addition to fabricating the entire monolithic photonic integrated circuit, the present techniques provide for fabricating discrete nanowire lasers, detectors, and dielectric waveguides.

In some implementations, fabrication of discrete edge emitting semiconductor laser devices, which are also referred to as laser diodes or diode lasers, was initiated by planarizing the nanowire array with Parylene, which was deposited by physical vapor deposition (PVD) at room temperature. It has been reported that Parylene is transparent at the wavelength of about 1.3 µm. Furthermore, Parylene helps to passivate the nanowire surfaces and enhances the internal quantum efficiency by about 10% to 12%.

Excess Parylene is etched to expose the nanowire tips, which are treated with ammonium sulfide to reduce the p-contact resistance. Ridge waveguide devices were fabricated by a combination of reactive ion etching (RIE), photolithography and contact metal deposition. The Aluminum (Al) n-ohmic contact was formed on the Si substrate surface and the Nickel/Gold (Ni/Au) p-ohmic contact was formed on the top to the exposed $p^+$-GaN nanowire tips. Ridge widths of 5 µm to 50 µm (for example as depicted in FIG. 3A) were defined by etching and cavity lengths of 0.5 mm to 2 mm were defined by dicing the substrate. This was followed by planarization with $SiO_2$ and interconnect and contact pad deposition. The cleaved facets were further polished by focused ion beam (FIB) etching using a Ga source and 3 pairs of $MgF_2/ZnSe$ (237 nm/132 nm) distributed Bragg reflectors (DBR) were deposited on both facets to attain a reflectivity of 88%. The contact geometry was arranged in a ground-signal-ground configuration to facilitate high frequency probing. The laser diodes are characterized by a forward turn-on voltage of ~3 V, a series resistance of 10Ω to 25Ω, and reverse breakdown voltage of 8 V to 12 V.

Figure 5:
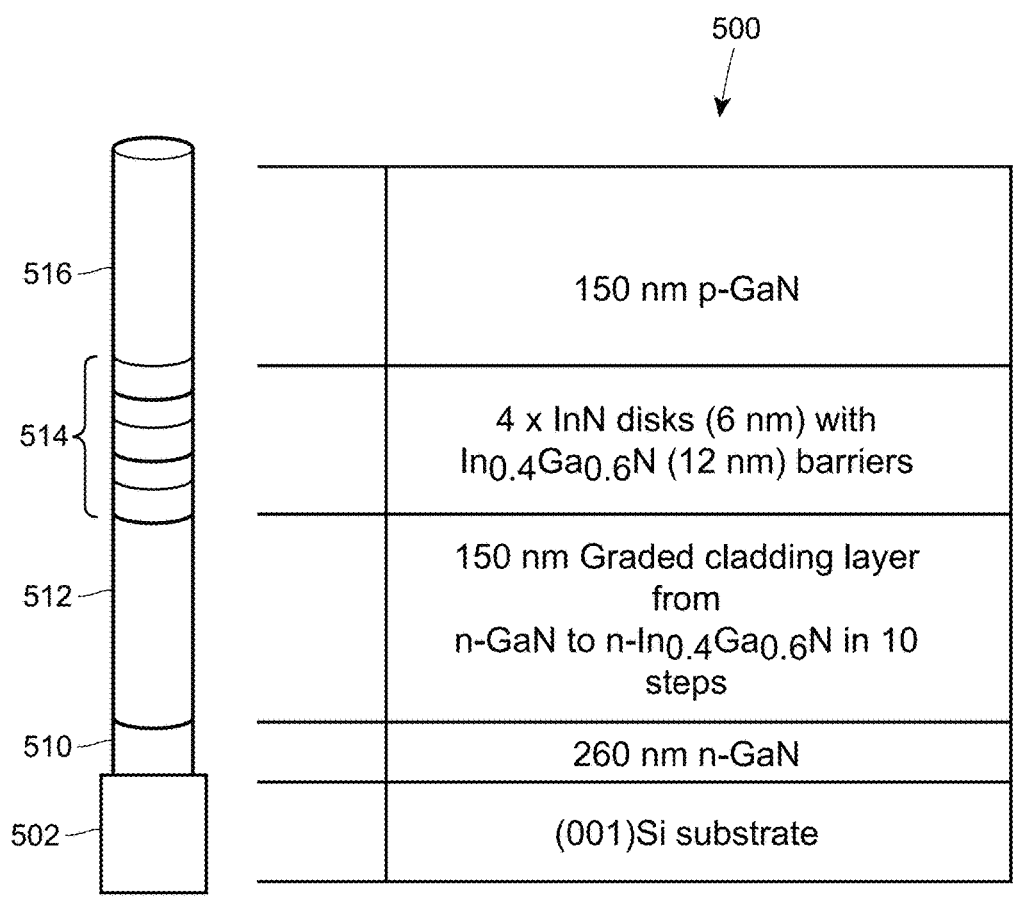
FIG. 5 depicts the epitaxial crystal structure of another example monolithically grown nanowire semiconductor laser, in particular showing a laser capable of emitting at a near infra-red wavelength of at or about 1.3 μm, in accordance with an example.

FIG. 5 depicts an individual nanowire structure 500 and the epitaxial composition of a nanowire structure within the structure of a semiconductor quantum laser grown monolithically on Silicon substrate and emitting at near infra-red wavelength of at or about 1.3 µm. In the illustrated example, grown on a Si substrate 502 is a 260 nm n-GaN layer 510. On top of this layer 510, grown in ten steps, is a group 512 of 150 nm thick graded cladding layers from n-GaN to n-In$_{0.4}$Ga$_{0.6}$N. On top of this group 512 of layers are the active region 514 layers. The active region 514 of this structure includes 4 layers of InN each about 6 nm thick. These InN layers are surrounded by In$_{0.4}$Ga$_{0.6}$N barrier layers of about 12 nm thickness. The InN layers form quantum structures which in the illustrated example are quantum disks. On top of the active region 516 of the nanowire structure grown is a 150 nm p-GaN layer.

Figure 6:
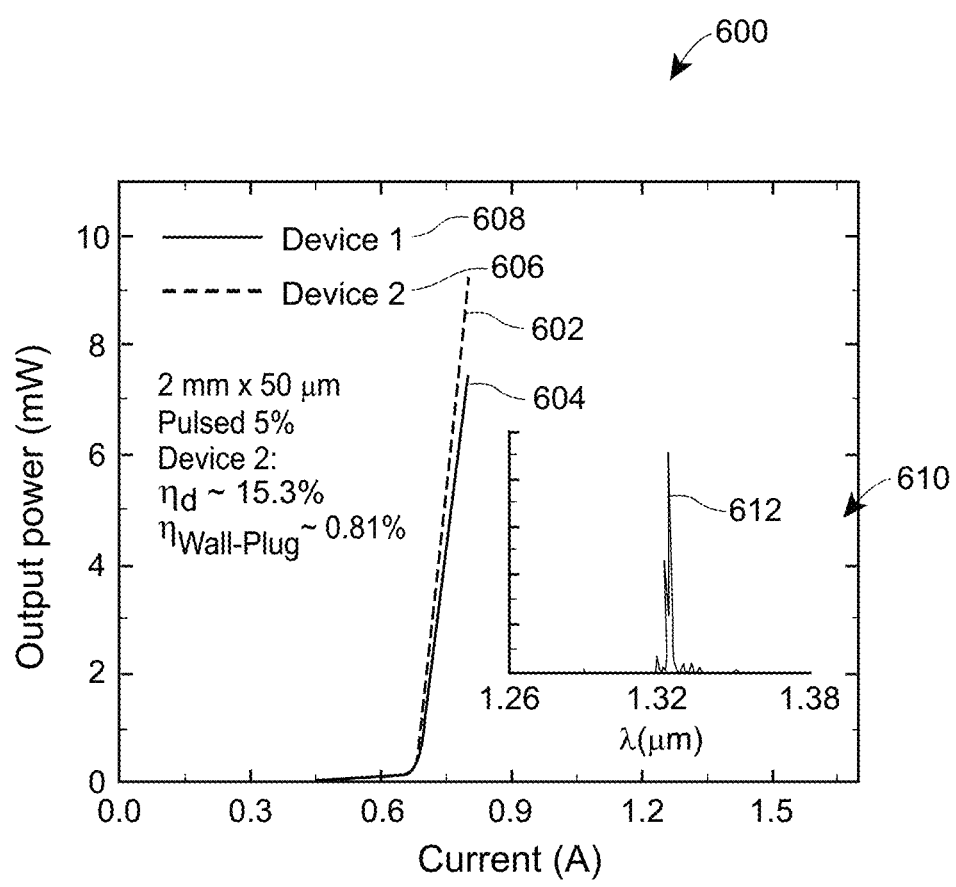
FIG. 6 depicts Light-Current (L-I) characteristic plots of a broad area near infra-red (NIR) semiconductor laser devices with emission wavelength of about 1.3 μm, in accordance with an example herein. The inset shows the output spectral characteristics for an injection current of 810 mA. The plot depicts the steady-state L-I characteristics at room temperature of an example 50 μm×2 mm ridge waveguide laser operating under Continuous Wave (CW) and pulsed (5% duty cycle) modes of operation. Output powers up to ~10 mW were measured at room temperature without any heat sinking or facet cooling. The output spectrum depicted in the inset confirms 1.3 μm peak emission. The slope efficiency was 0.14 W/A. A low value of threshold current $I_{th}$=673 mA was measured. The laser emission wavelength was in the near infra-red range of the spectrum at a wavelength of about 1.3 μm.

FIG. 6 provides a plot 600 of the experimentally measured Light-Current (L-I) characteristic plots 602 and 604 of broad area near infra-red (NIR) semiconductor laser devices 606 and 608, respectively, each having emission wavelength of about 1.3 μm. The inset 610 shows the output wavelength characteristic plot for an injection current of 810 mA. The plot 600 depicts the steady-state L-I characteristics at room temperature of a 50 μm×2 mm ridge waveguide laser device operating under pulsed (5% duty cycle) mode of operation. Output powers up to ~10 mW were measured at room temperature without any heat sinking or facet cooling. The output spectrum 612 depicted in the inset 610 confirms 1.3 μm peak wavelength of emission. The slope efficiency was 0.14 W/A. A low value of threshold current I$_{th}$=673 mA was measured. The wall plug efficiency parameter was ~0.81%.

Figure 7:
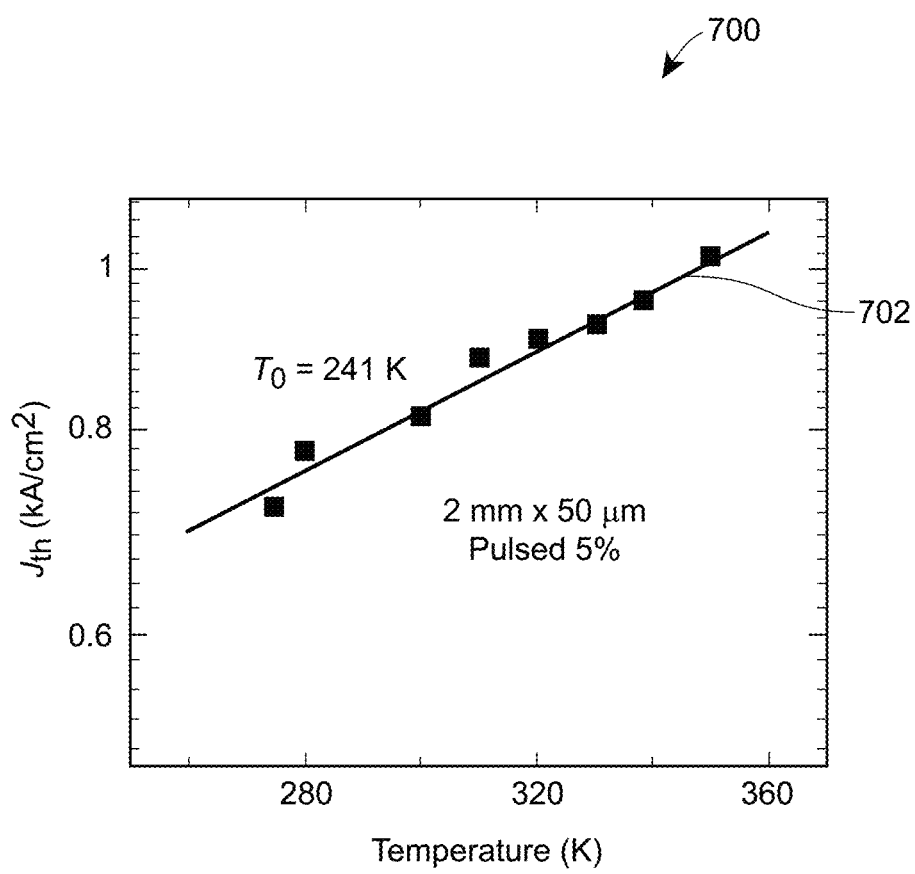
FIG. 7 depicts a plot of temperature dependence of the threshold current density $J_{th}$ for a nanowire semiconductor laser having an emission in the near infra-red range of at or about 1.3 μm, in accordance with an example.

FIG. 7 is a plot 700 of the temperature dependence of the threshold current density J$_{th}$. Linear fit line 702 indicates a characteristic temperature T$_0$=241 K. The data in this diagram are associated with nanowire structures of dimensions as shown. The nanowire structure was operated under a 5% pulsed mode of operation. In this example, the nanowire structure was formed as a laser having an emission wavelength in the near infra-red range of the spectrum at a wavelength of at or about 1.3 μm.

Figure 8:
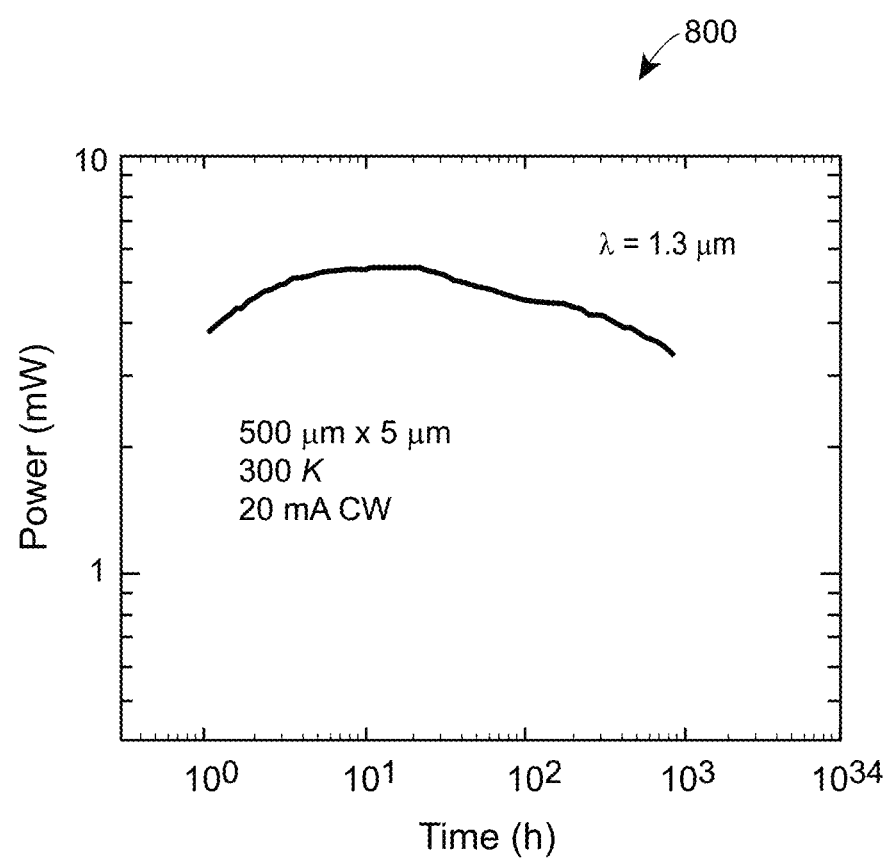
FIG. 8 depicts a plot of measured output power versus time (for a continuous wave current injection) for a 1.3 μm nanowire semiconductor laser formed as a disk-in-nanowire semiconductor quantum laser, in accordance with an example. These measurements were made without any heat sinking or active cooling. The data indicates a lifetime of ~1000 hours, albeit much high lifetimes are achievable.

FIG. 8 illustrates a plot 800 of the measured output power of a 1.3 μm wavelength disk-in-nanowire semiconductor laser as a function of time with constant Continuous Wave (CW) current injection. These measurements were made without any heat sinking or active cooling. The plot 800 indicates a lifetime of ~1000 hours. Nanowire semiconductor lasers grown monolithically on Silicon substrate have the potential for much higher lifetimes than what is depicted here. In this example, the nanowire structure or array based laser has dimensions of 5 μm width by 500 μm cavity length. The device is operating at a temperature of 300 K and at a CW current of 20 mA.

Figure 9:
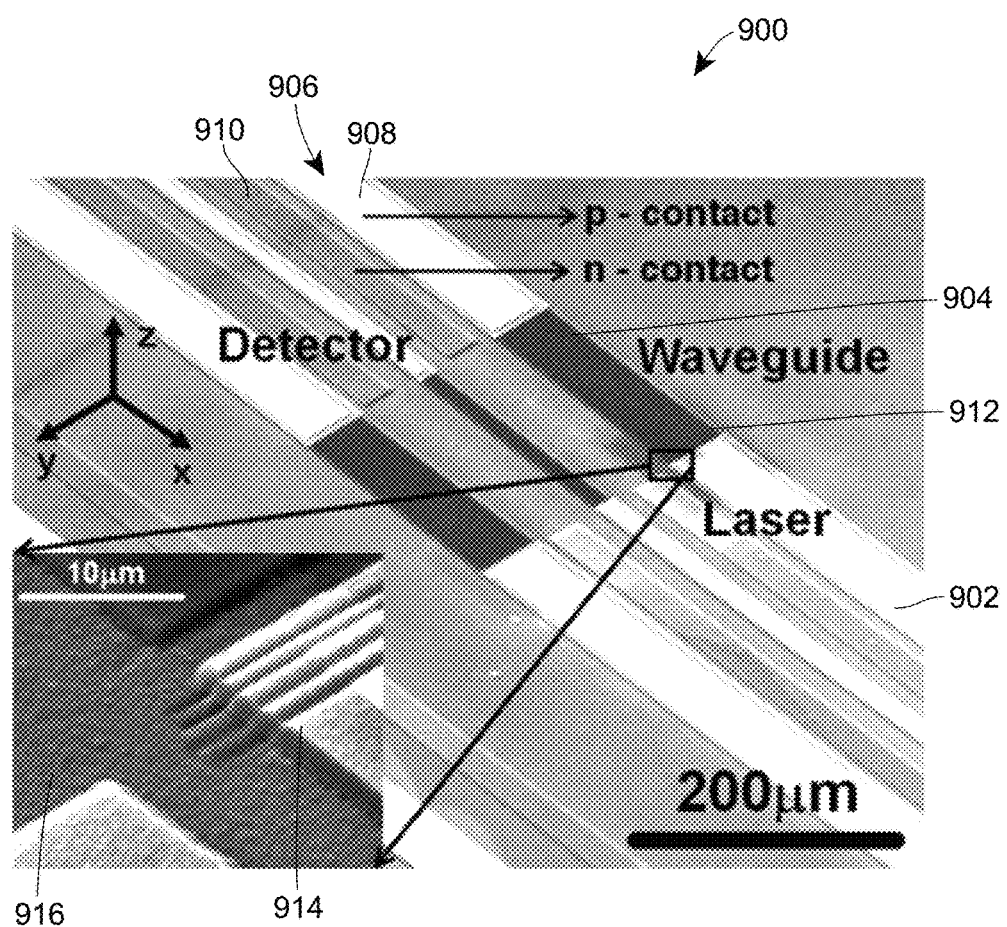
FIG. 9 is a SEM image of a monolithically grown photonic integrated circuit formed of arrays of nanowire structures. Specifically, an edge-emitting semiconductor laser and a guided-wave nanowire photodiode are formed with the same nanowire array and $SiO_2/Si_3N_4$ dielectric waveguide is formed in between the laser and the photodetector. The inset on the lower left corner of the picture depicts a magnified image of an air/nanowire Distributed-Bragg-reflector (DBR) mirror formed by Focused-Ion-Beam (FIB) etching technique.

The fabrication of the photonic integrated circuit follows similar process steps to the fabrication of discrete devices. The details of an example photonic integrated circuit fabrication process are described further below. A SEM image of the entire photonic circuit 900 is depicted in FIG. 9 wherein a laser 902, a waveguide 904, a detector 906, a p-contact 908 and a n-contact 910 for current injection are indicated. In the fabrication of the photonic integrated circuit 900, the dielectric waveguide 904 which is in between the nanowire laser 902 and detector 906 is formed by selective etching of the nanowires and the deposition of 400 nm SiO$_2$ followed by 400 nm of Si$_3$N$_4$. For the laser 902, the mirror facet away from the waveguide (not visible) was made reflective by FIB etching and subsequent deposition of MgF$_2$/ZnSe DBR layers and the mirror facet 912 coupled to the waveguide 904 was made reflective with 4 pairs of air/nanowire-Parylene DBR layers 914 (see inset image 916), also formed by FIB etching. For the detector 906, ~220 nm of anti-reflective SiO$_2$ was deposited on the facet of the detector that is not coupled to the waveguide.

Figure 10A:
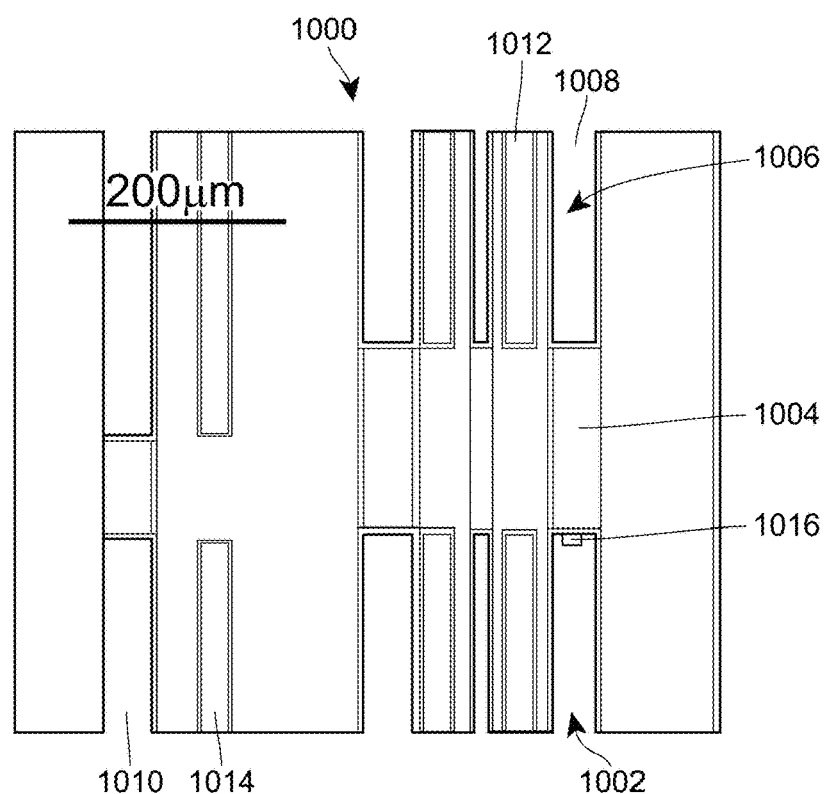
FIGS. 10A and 10B depicts a SEM image (top image FIG. 10A) and an optical microscope image (bottom image FIG. 10B) of a photonic integrated circuit, in accordance with an example. Note that the size scales of the two images are not the same. Similar to FIG. 16, the photonic integrated circuit includes a semiconductor laser, a linear waveguide structure, and a semiconductor photodetector. The semiconductor laser and the semiconductor photodetector are both III-GaN nanowire array structures that are formed monolithically on a Silicon substrate.
Figure 10B:
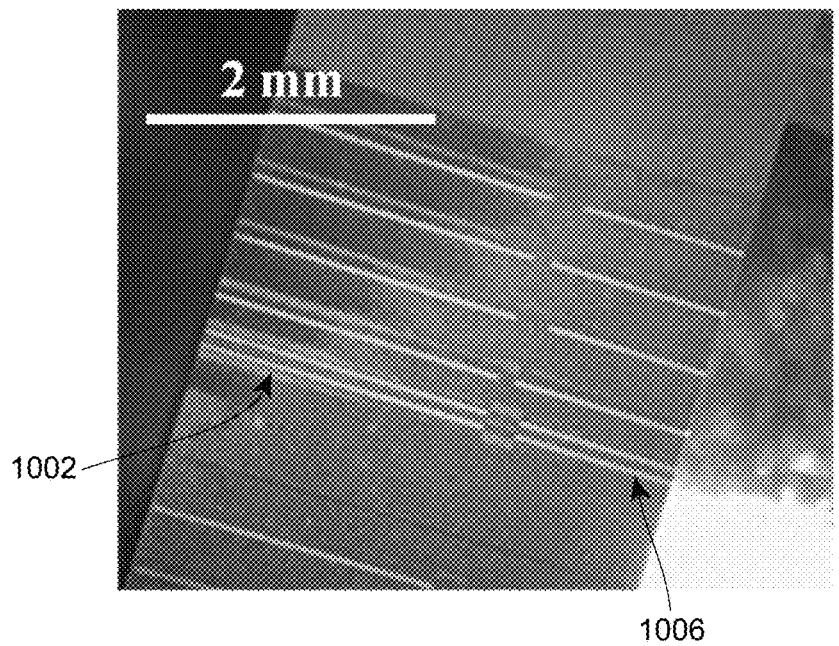

FIGS. 10A and 10B depict a SEM image (top image FIG. 10A) and an optical microscope image (bottom image FIG. 10B) of a photonic integrated circuit structure 1000, respectively. The photonic integrated circuit 1000 may be like that of device 900 shown in FIG. 9. The SEM image of FIG. 10A depicts a planar top view SEM image of the device.

In the illustrated example of the photonic integrated circuit 1000, there is a semiconductor laser 1002, a linear waveguide structure 1004, and a semiconductor photodetector 1006 fabricated in a linearly aligned arrangement. Also indicated are two p-contact metallic pads 1008 and 1010 and two n-contact metallic pads 1012 and 1014. Also indicated is the mirror facet 1016 of the laser 1002. The semiconductor laser 1002 and the semiconductor photodetector 1006 are both III-GaN nanowire array structures that are formed monolithically on a Silicon substrate.

Figure 11:
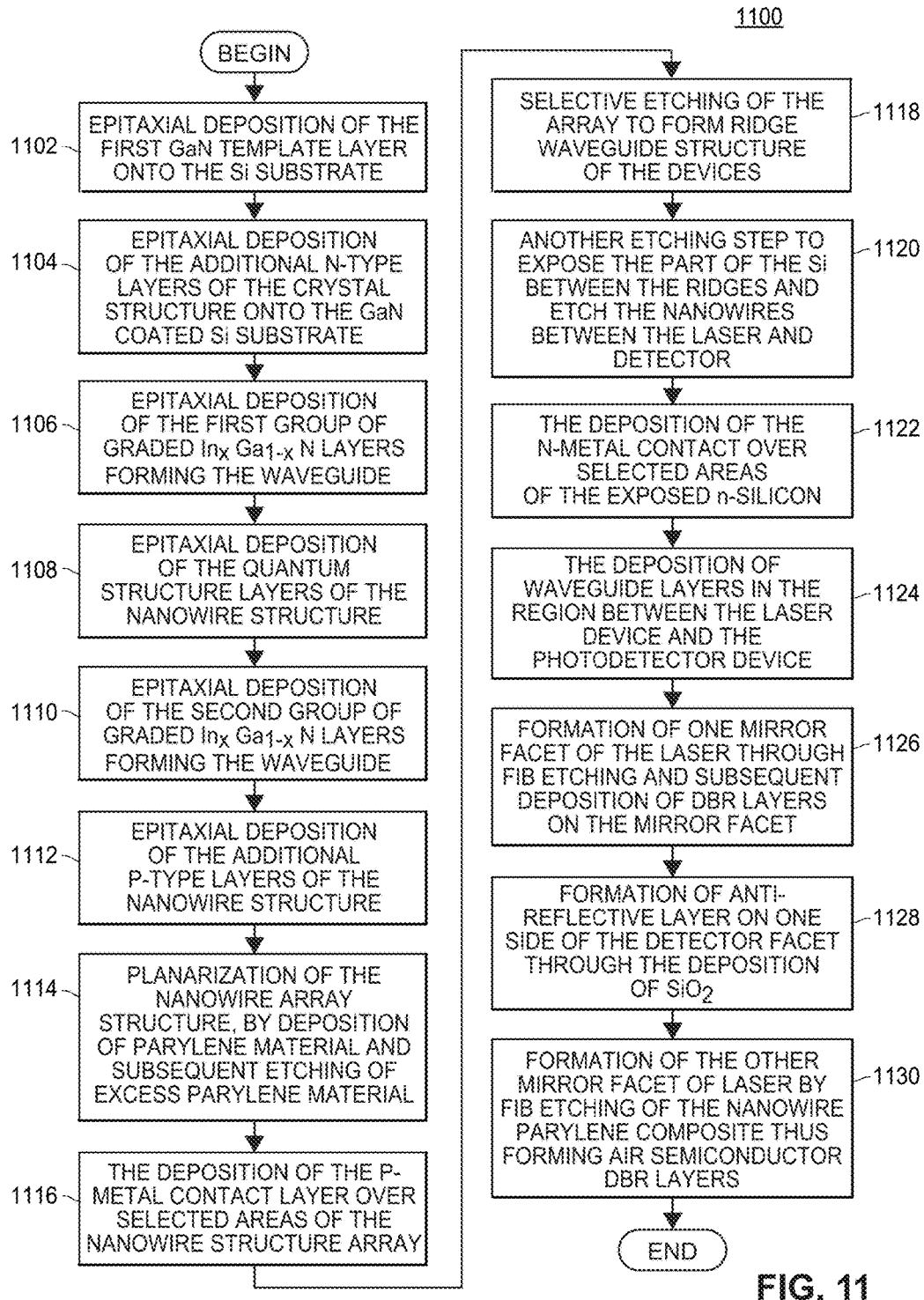
FIG. 11 depicts a process of fabricating a photonic integrated circuit formed of monolithically grown nanowire structures, in accordance with an example.

FIG. 11 depicts a process flow chart showing a fabrication process 1100 of fabricating a photonic integrated circuit. The method that is depicted is according to an example implementation. At a block 1102, the epitaxial deposition of the first GaN template layer onto the Silicon (Si) substrate is performed. At a block 1104, the epitaxial deposition of the additional n-type layers of the crystal structure onto the GaN coated Si substrate is performed. At a block 1106, epitaxial deposition of the first group of graded In$_x$Ga$_{1-x}$N layers forming the waveguide is performed. At a block 1108, the epitaxial deposition of the quantum structure layers of the nanowire structure is performed. At a block 1110, the epitaxial deposition of the second group of graded In$_x$Ga$_{1-x}$N layers forming the waveguide is performed. At a block 1112, the epitaxial deposition of the additional p-type layers of the nanowire structure is performed. At blocks 1102 to 1112 the processes associated with the epitaxial crystal growth process phase of the fabrication process are shown. Below are described examples associated with the device fabrication phase of the fabrication process 1800.

At a block 1114, the planarization of the nanowire array structure, by deposition of Parylene material and subsequent etching of excess Parylene material is performed. At a block 1116, the deposition of the p-metal contact layer over selected areas of the nanowire structure array is performed. At a block 1118, the selective etching of the array to form ridge waveguide structure of the devices is performed. At a block 1120, another etching step to expose the part of the Si between the ridges and etch the nanowires between the laser and detector is performed. At a block 1122, the deposition of the n-metal contact over selected areas of the exposed n-Silicon is performed. At a block 1124, the deposition of waveguide layers in the region between the laser device and the photodetector device is performed. At a block 1126, the formation of one mirror facet of the laser through Focused Ion Beam (FIB) etching and subsequent deposition of Distributed Bragg Reflector (DBR) layers on the mirror facet is performed. At a block 1128, formation of anti-reflective layer on one side of the detector facet through the deposition of SiO$_2$ is performed. At block 1130, the formation of the other mirror facet of laser by FIB etching of the nanowire-Parylene composite and as a result forming air-semiconductor DBR layers are performed. The end result of the above mentioned processes of is the realization of the photonic integrated circuit.

Figure 12A:
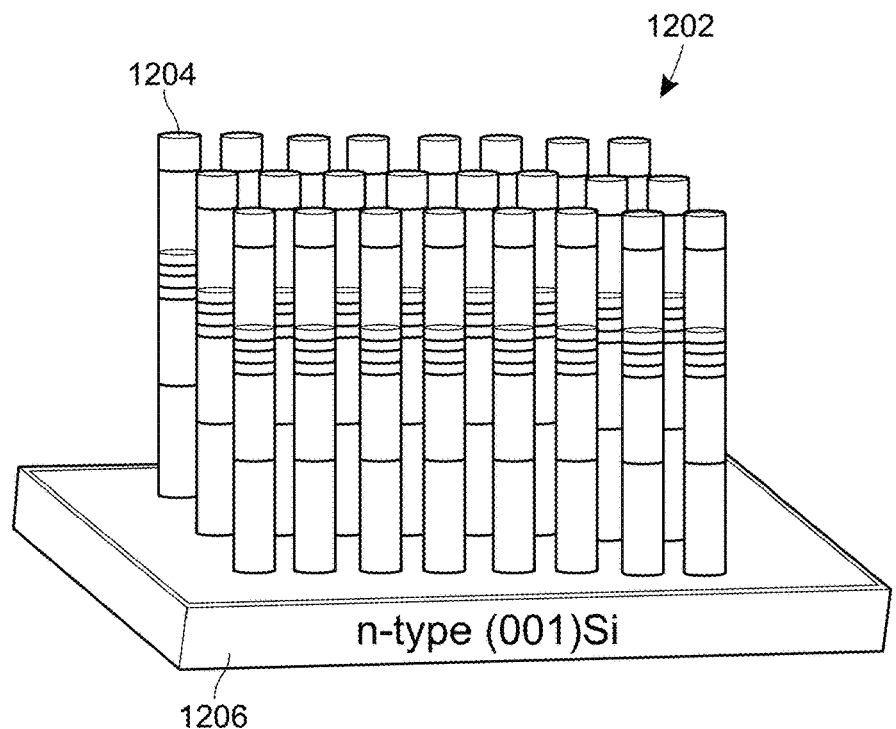
FIGS. 12A and 12B schematically illustrate fabricated nanowire arrays monolithically grown on a (001) Si substrate, as part of the photonic integrated circuit fabrication process of FIG. 11, in accordance with an example.
Figure 12B:
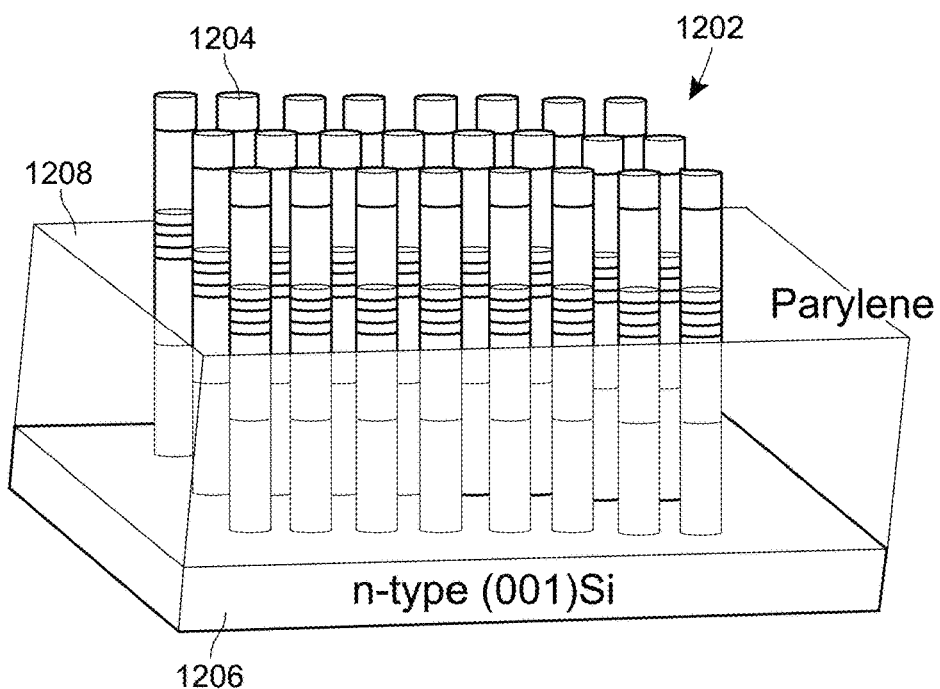
Figure 15:
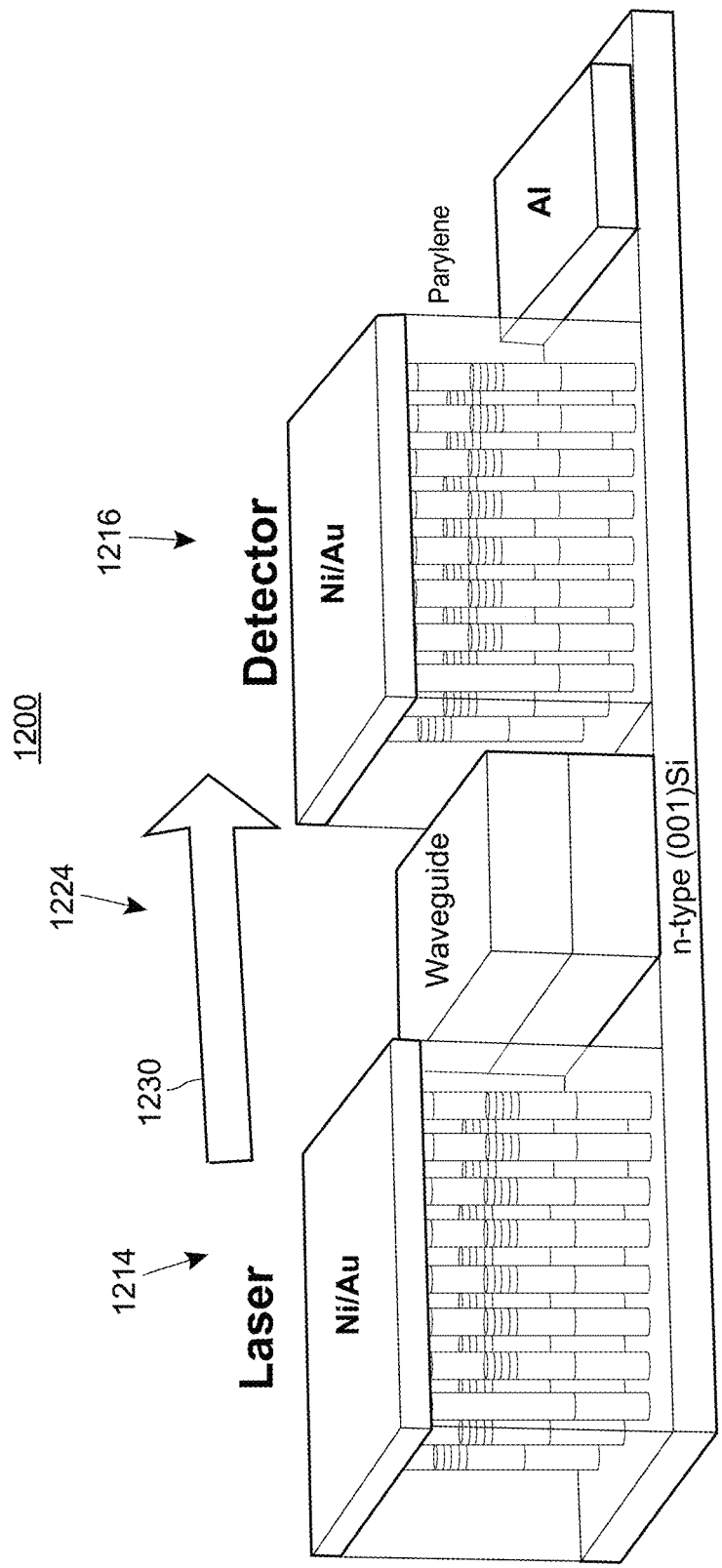
FIG. 15 depicts a schematic illustration of a formed photonic integrated circuit that includes a nanowire semiconductor laser and a nanowire semiconductor photodetector with a linear waveguide structure between the two devices.

FIGS. 12A and 12B depict part of the fabrication process 1100 of forming a photonic integrated circuit 1200 (see, FIG. 15). The figures show the growth of a nanowire array structure 1202, formed of individual nanowire structures 1204, grown monolithically on Silicon substrate 1206. FIG. 12A depicts the crystal growth of the nanowire structures on n-type (001) Si substrate using plasma assisted molecular beam epitaxy (PA-MBE) technique. FIG. 12B depicts a Parylene planarization of the nanowire array structure 1902, in which a Parylene material layer 1208 fills the empty space between the individual nanowire structures 1204.

Figure 13A:
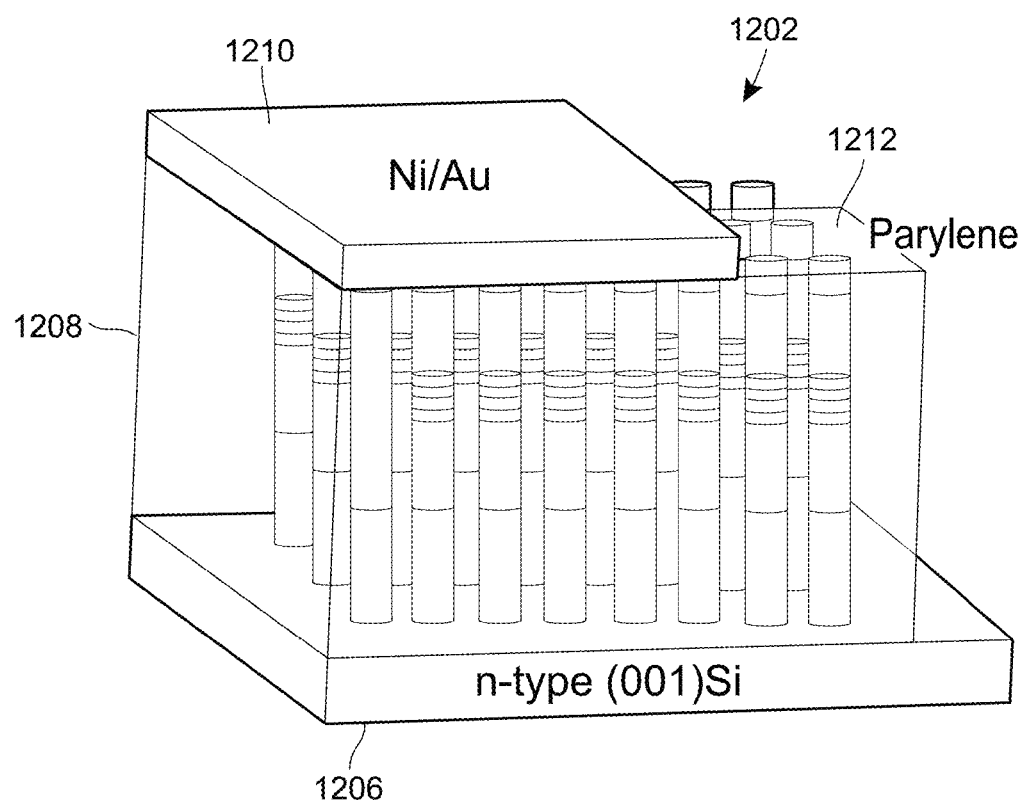
FIGS. 13A and 13B illustrate further processing in accordance with FIG. 11.
Figure 13B:
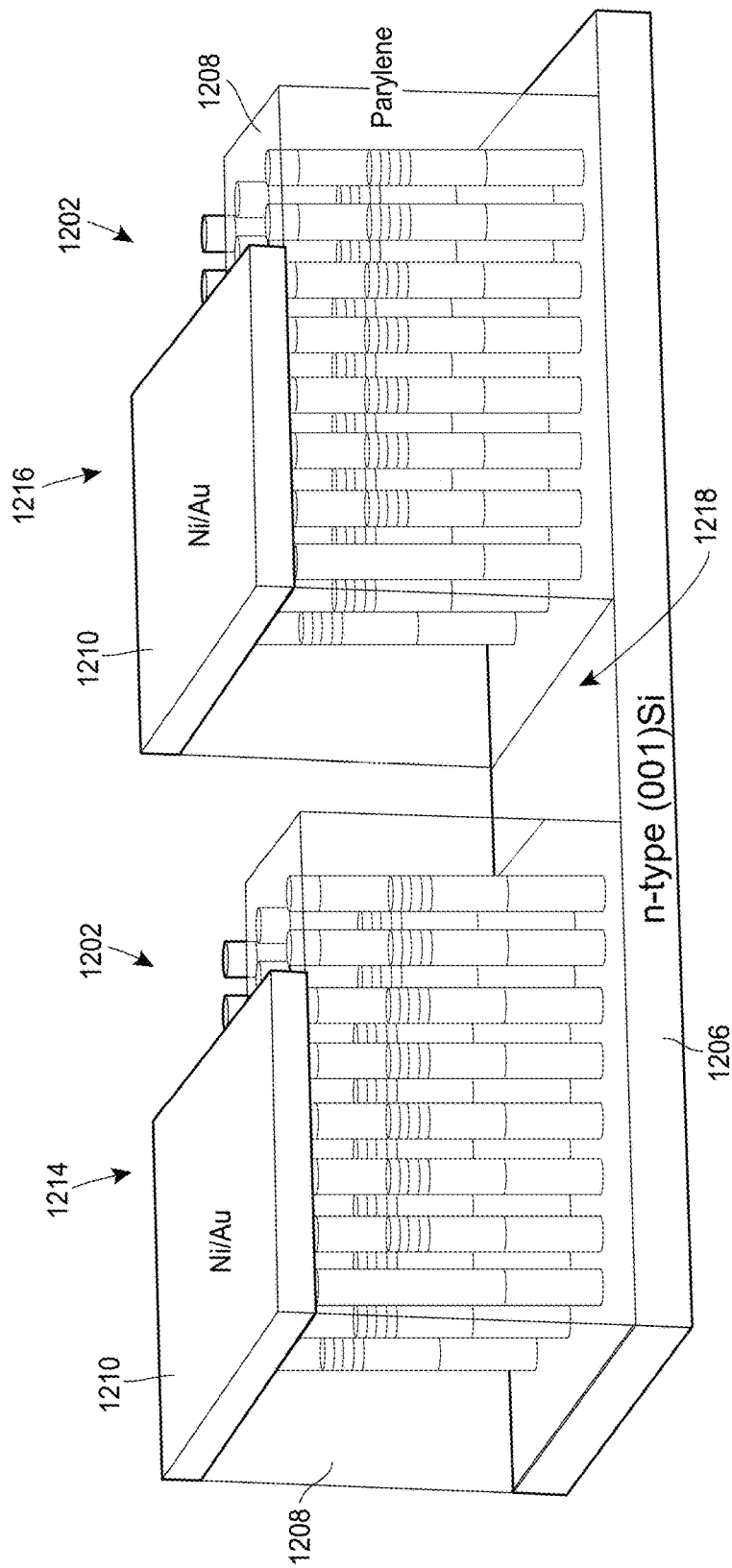

FIGS. 13A and 13B depict further processes of the growth of the nanowire structures on Silicon substrate 1206 and the formation of a monolithically grown photonic integrated circuit on a Silicon substrate. FIG. 13A depicts the process of p-metal deposition over selected areas of the nanowire structure array. A p-metal contact 1210 selectively covers some regions of the nanowire array 1202 while leaving exposed other regions 1212, where the exposed regions are exposed regions of Parylene in the illustrated example. FIG. 13B depicts the process of etching of the nanowire structure array 1202 in order to form channels on the sample between the regions where there are located a laser 1214 and a photodetector 1216. An etched channel 1218 is shown. FIG. 13B illustrates two p-contact metallic electrode 1210, one electrode for the laser 1214 and the other for the photodetector 1216.

Figure 14A:
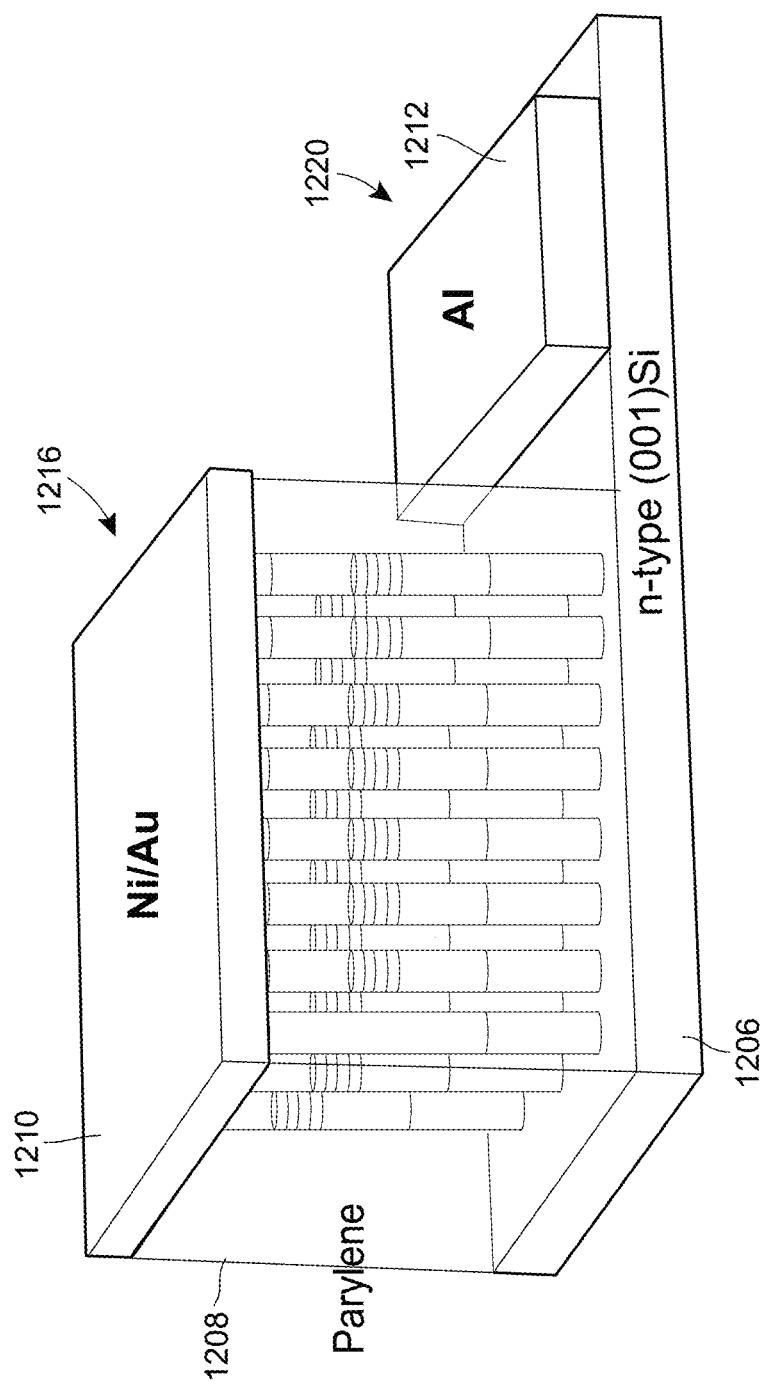
FIGS. 14A and 14B illustrate further processing in accordance with FIG. 11.
Figure 14B:
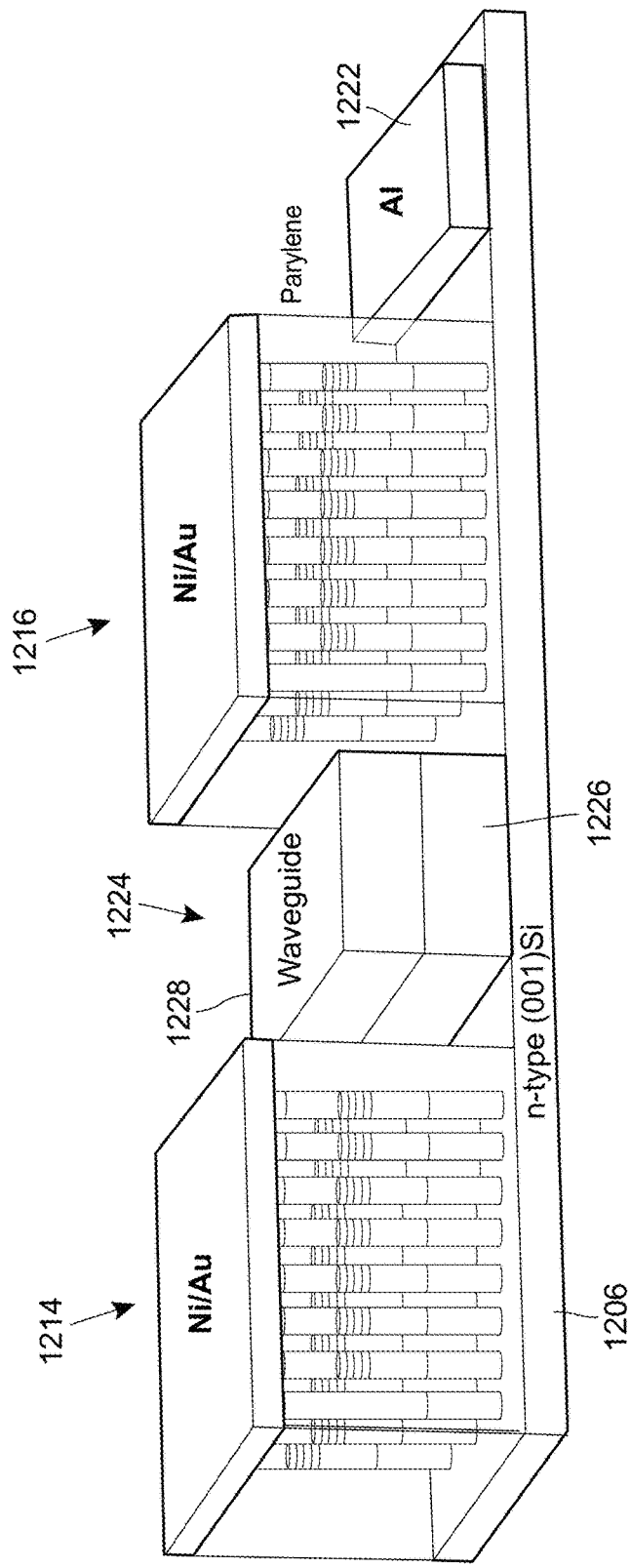

FIGS. 14A and 14B depict further processes for the monolithic growth of the nanowire structures on Silicon substrate and the formation of a monolithically grown photonic integrated circuit on a Silicon substrate. FIG. 14A depicts the process of n-metal deposition over selected areas of the exposed n-Silicon substrate 1206. An exposed area 1220 was created by the FIB etching process of FIG. 13B. The Parylene material 1208 that fills the empty area between the individual nanowire structures of the array 1202 is shown. A n-metal contact 1222 depicted here is Aluminum (Al) according to an example. The p-metal contact 1210 that is deposited over the detector 1216 is comprised of Nickel (Ni) and Gold (Au) layers according to an example. The n-metal contact 1222 is comprised of Aluminum (Al). FIG. 14B depicts the process of waveguide layers deposition in the region between the laser 1214 and the photodetector 1216. In this example, a waveguide structure 1224 is formed and comprises 400 nm thick $SiO_2$ bottom layer 1226 and 400 nm of $Si_3N_4$ top layer 1228. FIG. 15 provides a final schematic of the photonic integrated circuit 1200 formed by these processes. The laser 1214 produces an output emission 1230 at or about 1.3 µm. Output light 1230 is emitted from the laser 1214, travels through the waveguide structure 1224, and upon reaching the detector 1216 is absorbed as the input light.

As shown, the inventors have formed both laser and photodetector semiconductor photonic devices on (001) Si substrate in a monolithic fashion. The present techniques successfully demonstrate the coupling of the edge emitting laser emission into a monolithic dielectric waveguide and a subsequent coupling of the guided light into an in-plane guided wave photodiode (also referred to as photodetector). Either passive waveguides, such as those described, or other guided wave components can be used to form parts of an optical interconnect on a Silicon chip. The bottom-up monolithic approach demonstrated here allows optoelectronic integration with Si-based electronic circuits for laser biasing, modulation, and other controls. By virtue of the low growth temperature at which the nanowire heterostructures are grown it is expected that the integration will be compatible with CMOS processing of the electronics.

The present techniques show III-nitride nanowire lasers and photodiodes designed with nanowires having identical heterostructures and constituent materials section. Hence they can be realized by one-step epitaxy on (001) Si, adding significant flexibility to device and circuit fabrication. The nanowire heterostructure may include InN disks quantum regions and graded InGaN regions. Indeed, the present techniques successfully demonstrated the first use of pure InN quantum disks as the active region of III-nitride nanowire devices. While the large In flux required during epitaxy can substantially increase radial growth rate, inducing coalescence of adjacent nanowires, and such coalescence can deteriorate the optical quality (luminescence efficiency) of the nanowire array, the present techniques include all new growth parameters, e.g., compared to the ones used in nanowire growth for visible lasers. The results, including the formation of pure InN quantum disks, was unexpected. The In and Ga metal fluxes have been reduced by almost one order of magnitude compared to metal fluxes used in Ga-rich growths. To ensure low desorption of the metals, the growth temperature was also been reduced accordingly. The growth temperatures are almost 50 to 100 C. lower than the temperatures used in visible (Ga-rich) nanowire growth. The result has been the monolithic fabrication of a nanowire array based photonic integrated circuit having a laser, waveguide and a photodiode.

As will be appreciated, the present techniques provide considerable uniqueness and advantage over conventional concepts of nanowire fabrication, where some have proposed nanowire structures but with limited success and mostly applying what appears to be theoretical approaches, unsupported by actual fabrication. U.S. Pat. Nos. 8,212,235, 8,932,940, and 7,474,811, for example, provide merely general, and in places vague, concepts of nanowire optoelectronic devices, without any real examples. Their proposed nanowires are in a bridging configuration impractical to fabrication, and in configurations that suggest that monolithic nanowire structures are not even possible. Moreover, in most of the proposed devices, charged carriers (electrons and holes) and photons propagate along the axis of the nanowires and hence the optoelectronic devices are vertical and top-emitting or top-absorbing, which means the devices were confined to placement on (111) and (110) silicon and not compatible with CMOS technology and silicon photonics and (001) monolithic fabrication.

While examples herein are provided showing nanowires structures monolithically growth as dot-in-nanowire structures, other quantum active region configurations may be used such as core-shell nanowires. Further still, the present techniques may be used to fabricate the nanowire arrays and individual nanowire structures using a metallic mask with patterned holes used on the substrate in order to define the shape and the dimensions of the nanowire structures. It is possible to adopt a method of precisely controlling the formation of nanowire structures with precise predetermined diameter, height, spacing, and separation.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as an example only and does not describe every possible embodiment, as describing every possible embodiment would be impractical, if not impossible. One could implement numerous alternate embodiments, using either current technology or technology developed after the filing date of this application.

What is claimed:

1. A semiconductor device comprising:
    a Silicon (Si) substrate; and
    a III-Nitride nanowire structure having (i) a quantum region formed of one or more layers of InN quantum disks, (ii) a first graded layer region, and (iii) a second graded layer region, wherein the quantum region is located between the first graded layer region and the second graded layer region, and wherein the III-Nitride nanowire structure is monolithically grown from the Si substrate, and wherein the III-Nitride nanowire structure is responsive at or about 1.3 μm.

2. The semiconductor device of claim 1, wherein quantum region comprises a plurality of InN quantum disk layers each having at least one quantum dot, at least one quantum arch-shaped form, at least one quantum dot within a quantum disk, at least one core-shell quantum structure, or a combination of thereof.

3. The semiconductor device of claim 2, wherein each of the plurality of InN quantum disk layers has at least one quantum dot.

4. The semiconductor device of claim 3, wherein each of the plurality of InN quantum disk layers is separated by an $In_xGa_{1-x}N$ barrier.

5. The semiconductor device of claim 1, wherein the III-nitride nanowire structure is an In-N nanowire structure, wherein the first graded region comprises a plurality of n-type $In_xGa_{1-x}N$ layers, and the second graded region comprises a plurality of p-type $In_yGa_{1-y}N$ layers.

6. The semiconductor device of claim 5, where x is different for each of the plurality of n-type layers and wherein y is different for each of the plurality of p-type layers.

7. The semiconductor device of claim 1, further comprising:
    a lower region formed of one or more n-type GaN layers grown between the Si substrate and the first graded layer region; and
    an upper region formed of one or more p-type GaN layers grown on the second graded layer region.

8. The semiconductor device of claim 1, wherein the III-Nitride nanowire structure is formed as a nanowire semiconductor laser.

9. The semiconductor device of claim 1, wherein the III-Nitride nanowire structure is formed as an edge emitting nanowire semiconductor laser.

10. The semiconductor device of claim 1, wherein the III-Nitride nanowire structure is formed as vertical surface emitting nanowire semiconductor laser.

11. The semiconductor device of claim 1, wherein the III-Nitride nanowire structure is formed as a nanowire semiconductor photodetector.

12. The semiconductor device of claim 1, further comprising a Silicon Nitride layer coated on the Si substrate, such that the III-Nitride nanowire structure is monolithically grown from the Si substrate via the Silicon Nitride layer.

13. The semiconductor device of claim 1, further comprising a Gallium Nitride layer coated on the Si substrate, such that the III-Nitride nanowire structure is monolithically grown from the Si substrate via the Gallium Nitride layer.

14. The nanowire array structure of claim 1, wherein the plurality of III-Nitride nanowire structures form a nanowire semiconductor laser.

15. The nanowire array structure of claim 1, wherein the plurality of III-Nitride nanowire structures form an edge emitting nanowire semiconductor laser.

16. The nanowire array structure of claim 1, wherein the plurality of III-Nitride nanowire structures form a nanowire semiconductor photodetector.

17. A Nanowire array structure comprising:
    a Silicon (Si) substrate; and
    a plurality of III-Nitride nanowire structures each having (i) a quantum region formed of one or more layers of InN quantum disks, (ii) a first graded layer region, and (iii) a second graded layer region, wherein the quantum region is located between the first graded layer region and the second graded layer region,
    wherein the plurality of III-Nitride nanowire structures are monolithically grown from the Si substrate, and
    wherein the plurality of III-Nitride nanowire structures are responsive at or about 1.3 μm.

18. A photonic integrated circuit comprising:
    a Silicon (Si) substrate;
    a first plurality of III-Nitride Nanowire structures each having (i) a quantum region formed of one or more layers of inN quantum disks, (ii) a first graded layer region, and (iii) a second graded layer region, wherein the quantum region is located between the first graded layer region and the second graded layer region, wherein the first plurality of III-Nitride nanowire structures are monolithically grown from the Si substrate, and wherein the first plurality of III-Nitride nanowire structures form a nanowire semiconductor laser capable of emitting a photonic output at or about 1.3 μm; and
    a second plurality of III-Nitride nanowire structures each having (i) a quantum region formed of one or more layers of InN quantum disks, (ii) a first graded layer region, and (iii) a second graded layer region, wherein the quantum region is located between the first graded layer region and the second graded layer region, wherein the second plurality of III-Nitride nanowire structures are monolithically grown from the Si substrate, and wherein the second plurality of III-Nitride nanowire structures form a nanowire semiconductor photodetector capable of absorbing a photon input at or about 1.3 μm.

19. The photonic integrated circuit of claim 18, wherein the nanowire semiconductor laser and the nanowire semiconductor photodetector have the same heterostructure.

20. The photonic integrated circuit of claim 18, wherein the nanowire semiconductor laser and the nanowire semiconductor photodetector are formed using a single-step selective-area growth epitaxial process.

21. The photonic integrated circuit of claim 18, wherein the nanowire semiconductor laser and the nanowire semiconductor photodetector are formed using a multiple-step selective-area growth epitaxial process.

22. The photonic integrated circuit of claim 18, further comprising a waveguide deposited on the Si substrate between the nanowire semiconductor laser and the nanowire semiconductor photodetector, wherein the waveguide is configured to propagate the photonic output from the nanowire semiconductor laser to the nanowire semiconductor photodetector.

* * * * *

UNITED STATES PATENT AND TRADEMARK OFFICE
CERTIFICATE OF CORRECTION

PATENT NO. : 10,305,250 B2
APPLICATION NO. : 15/809598
DATED : May 28, 2019
INVENTOR(S) : Pallab Bhattacharya et al.

Page 1 of 1

It is certified that error appears in the above-identified patent and that said Letters Patent is hereby corrected as shown below:

In the Claims

At Column 18, Line 27, "Nanowire" should be -- nanowire --.

At Column 18, Line 41, "Nanowire" should be -- nanowire --.

At Column 18, Line 43, "inN" should be -- InN --.

Signed and Sealed this
Fourteenth Day of January, 2020

Andrei Iancu
*Director of the United States Patent and Trademark Office*